(12) United States Patent
Karnezos

(10) Patent No.: US 7,394,148 B2
(45) Date of Patent: Jul. 1, 2008

(54) MODULE HAVING STACKED CHIP SCALE SEMICONDUCTOR PACKAGES

(75) Inventor: Marcos Karnezos, Palo Alto, CA (US)

(73) Assignee: Stats Chippac Ltd., Sinagpore (SG)

( * ) Notice: Subject to any disclaimer, the term of this patent is extended or adjusted under 35 U.S.C. 154(b) by 42 days.

(21) Appl. No.: 11/424,480

(22) Filed: Jun. 15, 2006

(65) Prior Publication Data

US 2006/0284299 A1     Dec. 21, 2006

Related U.S. Application Data

(60) Provisional application No. 60/693,033, filed on Jun. 20, 2005.

(51) Int. Cl.
*H01L 23/02*     (2006.01)
*H01L 21/00*     (2006.01)
*H05K 1/14*     (2006.01)

(52) U.S. Cl. .................... 257/686; 257/730; 257/780; 257/784; 361/784; 361/790; 361/792; 438/109; 438/125

(58) Field of Classification Search ........................ None
See application file for complete search history.

(56) References Cited

U.S. PATENT DOCUMENTS 5,222,014 A     6/1993 Lin (Continued)

FOREIGN PATENT DOCUMENTS

JP     05152505 A     6/1993

(Continued)

Primary Examiner—Alonzo Chambliss

(57) ABSTRACT

Stacked CSP (chip scale package) modules include a molded first ("top") chip scale package having a molding side and a substrate side, and a second ("bottom") package affixed to the substrate side of the top chip scale package, the second package being electrically connected to the first package by wire bonding between the first and second package substrates. Also, a method for making a stacked chip scale module includes: providing a first ("top") chip scale package including at least one first package die affixed to and electrically interconnected with a die attach side of a first package substrate, the first CSP being molded and without solder balls; dispensing adhesive on the land side of the first package substrate; providing a singulated second ("bottom") package including at least one second package die affixed to and electrically interconnected with a die attach side of a second package substrate, the second package being molded and without solder balls; affixing the second package onto the land side of the first package substrate, a surface of the molding of the second package contacting the adhesive on the land side of the first package substrate; curing the adhesive; performing a plasma clean; forming wire bond interconnections between the land side of the second package substrate and sites in a marginal area of the land side of the first package substrate; performing a plasma clean; forming a operation to enclose the marginal areas of the land side of the first substrate, the z-interconnection wire bonds and wire loops, the edges of the second package, and the marginal area on the land side of the second package, leaving exposed an area of the land side of the second substrate located within a marginal area; attaching second level interconnect solder balls to sites on the exposed area of the second package substrate; and (where the first substrate was provided in a strip or array) saw singulating to complete a unit assembly.

13 Claims, 16 Drawing Sheets

U.S. PATENT DOCUMENTS

| | | |
|---|---|---|
| 5,229,960 A | 7/1993 | De Givry |
| 5,340,771 A | 8/1994 | Rostoker |
| 5,373,189 A | 12/1994 | Massit et al. |
| 5,436,203 A | 7/1995 | Lin |
| 5,444,296 A | 8/1995 | Kaul et al. |
| 5,495,398 A | 2/1996 | Takiar et al. |
| 5,550,711 A | 8/1996 | Burns et al. |
| 5,652,185 A | 7/1997 | Lee |
| 5,744,863 A | 4/1998 | Culnane et al. |
| 5,898,219 A | 4/1999 | Barrow |
| 5,899,705 A | 5/1999 | Akram |
| 5,903,049 A | 5/1999 | Mori |
| 5,977,640 A | 11/1999 | Bertin et al. |
| 5,982,633 A | 11/1999 | Jeansonne |
| 5,994,166 A | 11/1999 | Akram et al. |
| 6,025,648 A | 2/2000 | Takahashi et al. |
| 6,034,875 A | 3/2000 | Heim et al. |
| 6,075,289 A | 6/2000 | Distefano |
| 6,118,176 A | 9/2000 | Tao et al. |
| 6,133,626 A | 10/2000 | Hawke et al. |
| 6,157,080 A | 12/2000 | Tamaki et al. |
| 6,165,815 A | 12/2000 | Ball |
| 6,201,266 B1 | 3/2001 | Ohuchi et al. |
| 6,201,302 B1 | 3/2001 | Tzu |
| 6,238,949 B1 | 5/2001 | Nguyen et al. |
| 6,265,766 B1 | 7/2001 | Moden |
| 6,274,930 B1 | 8/2001 | Vaiyapuri et al. |
| 6,316,838 B1 | 11/2001 | Ozawa et al. |
| 6,333,552 B1 | 12/2001 | Kakimoto et al. |
| 6,340,846 B1 | 1/2002 | LoBianco et al. |
| 6,376,904 B1 | 4/2002 | Haba et al. |
| 6,388,313 B1 | 5/2002 | Lee et al. |
| 6,400,007 B1 | 6/2002 | Wu et al. |
| 6,407,456 B1 | 6/2002 | Ball |
| 6,413,798 B2 | 7/2002 | Asada |
| 6,414,381 B1 | 7/2002 | Takeda |
| 6,424,050 B1 | 7/2002 | Komiyama |
| 6,441,496 B1 | 8/2002 | Chen et al. |
| 6,445,064 B1 | 9/2002 | Ishii et al. |
| 6,462,421 B1 | 10/2002 | Hsu et al. |
| 6,472,732 B1 | 10/2002 | Terui |
| 6,489,676 B2 | 12/2002 | Taniguchi et al. |
| 6,492,726 B1 | 12/2002 | Quek et al. |
| 6,501,165 B1 | 12/2002 | Farnworth |
| 6,512,303 B2 | 1/2003 | Moden |
| 6,538,319 B2 | 3/2003 | Terui |
| 6,545,365 B2 | 4/2003 | Kondo et al. |
| 6,545,366 B2 | 4/2003 | Michii et al. |
| 6,552,423 B2 | 4/2003 | Song et al. |
| 6,555,902 B2 | 4/2003 | Lo et al. |
| 6,555,917 B1 | 4/2003 | Heo |
| 6,570,249 B1 | 5/2003 | Liao et al. |
| 6,583,503 B2 | 6/2003 | Akram et al. |
| 6,590,281 B2 | 7/2003 | Wu et al. |
| 6,593,647 B2 | 7/2003 | Ichikawa |
| 6,593,648 B2 | 7/2003 | Emoto |
| 6,593,662 B1 | 7/2003 | Pu et al. |
| 6,599,779 B2 | 7/2003 | Shim et al. |
| 6,607,937 B1 | 8/2003 | Corisis |
| 6,611,063 B1 | 8/2003 | Ichinose et al. |
| 6,621,169 B2 | 9/2003 | Kikuma et al. |
| 6,621,172 B2 | 9/2003 | Nakayama et al. |
| 6,649,448 B2 | 11/2003 | Tomihara |
| 6,650,019 B2 | 11/2003 | Glenn et al. |
| 6,667,556 B2 | 12/2003 | Moden |
| 6,690,089 B2 | 2/2004 | Uchida |
| 6,700,178 B2 | 3/2004 | Chen et al. |
| 6,706,557 B2 | 3/2004 | Koopmans |
| 6,734,539 B2 | 5/2004 | Degani et al. |
| 6,734,552 B2 | 5/2004 | Combs et al. |
| 6,737,750 B1 | 5/2004 | Hoffman et al. |
| 6,746,894 B2 | 6/2004 | Fee et al. |
| 6,747,361 B2 | 6/2004 | Ichinose |
| 6,762,488 B2 | 7/2004 | Maeda et al. |
| 6,777,799 B2 | 8/2004 | Kikuma et al. |
| 6,777,819 B2 | 8/2004 | Huang |
| 6,787,915 B2 | 9/2004 | Uchida et al. |
| 6,787,916 B2 | 9/2004 | Halahan |
| 6,794,749 B2 | 9/2004 | Akram |
| 6,818,980 B1 | 11/2004 | Perdon, Jr. |
| 6,828,665 B2 | 12/2004 | Pu et al. |
| 6,835,598 B2 | 12/2004 | Baek et al. |
| 6,838,761 B2 | 1/2005 | Karnezos |
| 6,847,105 B2 | 1/2005 | Koopmans |
| 6,861,288 B2 | 3/2005 | Shim et al. |
| 6,864,566 B2 | 3/2005 | Choi, III |
| 6,882,057 B2 | 4/2005 | Hsu |
| 6,890,798 B2 | 5/2005 | McMahon |
| 6,900,528 B2 | 5/2005 | Mess et al. |
| 6,906,415 B2 | 6/2005 | Jiang et al. |
| 6,906,416 B2 | 6/2005 | Karnezos |
| 6,930,378 B1 | 8/2005 | St. Amand et al. |
| 6,930,396 B2 | 8/2005 | Kurita et al. |
| 6,933,598 B2 | 8/2005 | Karnezos |
| 6,951,982 B2 | 10/2005 | Chye et al. |
| 6,972,481 B2 | 12/2005 | Karnezos |
| 7,034,387 B2 | 4/2006 | Karnezos |
| 7,034,388 B2 | 4/2006 | Yang et al. |
| 7,045,887 B2 | 5/2006 | Karnezos |
| 7,049,691 B2 | 5/2006 | Karnezos |
| 7,053,476 B2 | 5/2006 | Karnezos |
| 7,053,477 B2 | 5/2006 | Karnezos |
| 7,057,269 B2 | 6/2006 | Karnezos |
| 7,061,088 B2 | 6/2006 | Karnezos |
| 7,064,426 B2 | 6/2006 | Karnezos |
| 7,071,568 B1 | 7/2006 | St. Amand et al. |
| 7,081,648 B2 | 7/2006 | Tsai |
| 7,101,731 B2 | 9/2006 | Karnezos |
| 7,119,427 B2 | 10/2006 | Kim |
| 2002/0096755 A1 | 7/2002 | Fukui et al. |
| 2002/0130404 A1 | 9/2002 | Ushijima et al. |
| 2003/0113952 A1 | 6/2003 | Sambasivam et al. |
| 2003/0153134 A1 | 8/2003 | Kawata et al. |
| 2004/0016939 A1 | 1/2004 | Akiba et al. |
| 2004/0061213 A1 | 4/2004 | Karnezos |
| 2004/0201087 A1 | 10/2004 | Lee |
| 2004/0212096 A1 | 10/2004 | Wang |
| 2005/0040508 A1* | 2/2005 | Lee ............................ 257/686 |
| 2006/0043556 A1 | 3/2006 | Su et al. |
| 2006/0138631 A1 | 6/2006 | Tao et al. |
| 2006/0189033 A1 | 8/2006 | Kim |
| 2006/0197209 A1 | 9/2006 | Choi et al. |
| 2006/0220210 A1* | 10/2006 | Karnezos et al. ............ 257/686 |

FOREIGN PATENT DOCUMENTS

| | | |
|---|---|---|
| JP | 2001223326 A | 8/2001 |
| KR | 20010688614 A | 7/2001 |
| KR | 2004085348 A | 10/2004 |

* cited by examiner

MODULE HAVING STACKED CHIP SCALE SEMICONDUCTOR PACKAGES

CROSS-REFERENCE TO RELATED APPLICATIONS

This application claims priority from U.S. Provisional Application No. 60/693,033, titled "Module having stacked chip scale semiconductor packages", filed Jun. 20, 2005, which is incorporated herein by reference.

This application is related to U.S. application Ser. No. 11/395,529, titled "Semiconductor stacked package assembly having exposed substrate surfaces on upper and lower sides"; U.S. application Ser. No. 11/397,027, titled "Semiconductor assembly including chip scale package and second substrate and having exposed substrate surfaces on upper and lower sides"; and U.S. application Ser. No. 11/394,635, titled "Semiconductor package including second substrate and having exposed substrate surfaces on upper and tower sides"; all filed Mar. 31, 2006. Each of the said related applications is hereby incorporated herein by reference.

BACKGROUND

This invention relates to semiconductor packaging.

Portable electronic products such as mobile phones, mobile computing, and various consumer products require higher semiconductor functionality and performance in a limited footprint and minimal thickness and weight at the lowest cost. This has driven the industry to increase integration on the individual semiconductor chips, and also to implement integration on the "z-axis," that is, by stacking chips or by stacking die packages to form a stacked package assembly (stacked multi-package module).

Stacked package assemblies are employed in applications in which there is a need to provide a high degree of functional integration in an assembly having a minimal footprint and thickness. Portable telecommunications devices such as cellular telephones are an example of such applications, particularly where the telecommunications device includes, for example, capabilities for capture and display or play of images, audio or video.

Examples of functions that may desirably be integrated include devices for: various processes, including digital signal (DSP), ASIC, graphics (GPU); various memories, including Flash (NAND), Flash (NOR), SRAM, DRAM, MRAM; image and video capture, including optical sensor with memory; micro-electro-mechanical systems (MEMS) with processor and memory.

The z-interconnect between packages in a stacked package assembly is a critical technology from the standpoint of manufacturability, design flexibility and cost. Stacked package assemblies integrate chips and packages by stacking and electrically interconnecting them in the z-direction using wire bonds, or solder balls, or flip chip interconnection.

Stacked packages can provide numerous advantages. Particularly, each die or more than one die can be packaged in a respective package in the stack using the most efficient first level interconnect technology for the chip type and configuration, such as wire bonding or flip chip, to maximize performance and minimize cost.

It is desirable to be able to electrically test the stacked components (die or packages), so that the component can be rejected unless it shows satisfactory performance, before the packages are stacked. This permits maximizing the yield of the final stacked package assembly. To realize this advantage in practice, the packages must be configured to be testable using established test infrastructure. Generally, testing packaged die is preferable to testing individual die, as testing individual die can result in damage to interconnection pads on the die.

Often, the manufacturer of a product (particularly for example where the product is a portable communications device such as a cellular phone) determines the dimensions of a space in which the assembly must fit. That, is the manufacturer will demand that an assembly having specified functionalities have an overall footprint (length and width) and thickness within particular specifications. Presented with such limitations, the designer must, within cost limitations, be able to select packages and a stacking design and process that meet the demands for functionality within the limitations of thickness and footprint.

Accordingly, it is desirable to choose a multi-package stack structure and stacking process that provides design flexibility for the function designer. Particularly, for example, the designer should have flexibility, without having to redesign the structure or the process: to choose packages or chips from any of a variety of available vendors, to minimize component cost; to make changes in chip or package types within the assembly, to avoid having to re-qualify a changed assembly; and to complete the assembly stacking process at the final product stage on the surface mount assembly floor, to enable product configurations demanded by the market in the shortest practical time-to-market.

Meeting rapidly changing market demands can present challenges. For example, the general timeframe for designing a consumer device such as a cellular phone is typically longer than the timeframe for market shifts. A perception may develop in the industry that a particular functionality is desirable in a consumer device (e.g., web browsing functionality in a cellular phone), and designers may build that functionality into the assemblies; then within a short time it may become evident that the demand in the marketplace is not as had been perceived, and it may be desirable to remove that functionality or to present it in the marketplace as an option. Accordingly, it is desirable to be able to configure the device "on the fly", that is, to add or remove functionalities in a device without having to redesign the entire assembly.

It is desirable also to be able to stack off-the-shelf packaged chips, such as for example memory (Flash, SRAM, DRAM), over other packages in the assembly, using surface mount assembly methods employed in the industry for assembling products such as mobile communications devices (e.g., cellular phones) and computers. The type of memory for a product, in particular, can be different for different functionalities; for instance, if image capture functionality is desired in a cellular phone, a fast memory (DRAM) may be required.

The packages employed in stacked package assemblies and the manufacturing processes must be configured to enable both the physical stacking of the packages and the formation of electrical interconnections between them, using a chosen process for a chosen structure.

Stacked multi-package assemblies generally fall into two categories, namely, so-called "Package-on-Package" (PoP) assemblies, and so-called "Package-in-Package" (PiP) assemblies.

Examples of 2-stack PoP multi-package modules are shown for example in copending U.S. application Ser. No. 10/681,572, filed Oct. 8, 2003. In one example a first package (referred to as the "bottom" package) is similar to a standard BGA, having a die affixed to and electrically connected with the die attach side (the "upper" side) of a BGA substrate, and being cavity molded to provide a mold cap covering the die and electrical connections but leaving a marginal area of the die attach side of the substrate exposed. The side of the bottom package substrate opposite the die attach side (the "lower" side, which may be referred to as the "land" side) is provided with solder balls for second level interconnection of the module with underlying circuitry such as, for example, a motherboard. A second package (referred to as the "top" package) is stacked on the bottom package and is also similar to a standard BGA, except that the solder balls provided on the land side of the top package are arranged at the periphery of the top package substrate, so that they rest upon interconnection sites at the exposed marginal area of the die attach side of the bottom package. When the peripherally arranged balls are contacted with and then reflowed onto the peripherally located interconnect sites at the bottom package, they effect the z-interconnection without interference with the mold cap of the bottom BGA. The top package die and electrical connections are also encapsulated.

The type of z-interconnect employed in the PoP module requires that the top and bottom package substrates be designed with matching pads for the z-interconnect balls. If one of the packages is exchanged for one in which the substrate has a different pad arrangement (different size or different design), then the substrate for the other package must be reconfigured accordingly. This leads to increased cost for manufacture of the multi-package module. In the PoP configuration the distance between the top and bottom packages must be at least as great as the encapsulation height of the bottom package, which may be 0.25 mm or more, and typically is in a range between 0.5 mm and 1.5 mm, depending upon the number of die and depending upon whether the die-to-substrate electrical connection is by flip chip or by wire bonds. For example, for a single wire bonded die in the bottom package a moldcap of 300 um can typically accommodate a 75 um thick die. The z-interconnect solder balls must accordingly be of a sufficiently large diameter that when they are reflowed they make good contact with the bonding pads of the bottom BGA, without contact between the land side of the top package substrate and the upper surface of the bottom package mold cap; that is, the solder ball diameter must be greater than the encapsulation height by an amount that allows for solder ball collapse during reflow, plus a tolerance for noncoplanarities between balls and substrate. A typical design difference (additional clearance) between collapsed ball height and bottom mold cap height is about 25 um. For a moldcap having a thickness about 300 um, for example, z-interconnect solder balls greater than 300 um must be employed. A larger ball diameter dictates a larger ball pitch (typically about 0.65 mm pitch for 300 um balls, for example). That in turn limits the number of balls that can be fitted in the available space in the periphery of the bottom package substrate. Furthermore the peripheral arrangement of the solder balls forces the bottom BGA to be significantly larger than the mold cap of a standard BGA. And the peripheral arrangement of the solder balls increases the overall package size (the size increases according to the number of ball rows and the ball pitch). In standard BGAs the body size can be as much as about 2-3 mm larger than the mold cap. Moreover, the top package in a PoP configuration must be made of comparable size to the bottom one even though it may contain a small chip with many fewer interconnects. Increasing package footprint, to provide greater area for ball attachment (additional rows of balls, for example), may exceed the size limits for the particular application, and in any event entails longer wire bond spans and greater substrate area, both of which increase the cost of these components. Increasing the numbers of interconnections between packages may require that the top package substrate have at least two metal layers (and often more than two) to facilitate the routing within the substrate electrical connections. It may in some applications be impractical in a PoP configuration to stack two die in the bottom package, as this causes the bottom mold cap to be even thicker, exacerbating the problems described above.

Examples of two-stack PiP modules, having z-interconnection by wire bonds between the upward-facing sides of the top and bottom package substrates, are disclosed for example in copending U.S. application Ser. No. 10/632,549, filed Aug. 2, 2003, and copending U.S. application Ser. No. 10/681,572, filed Oct. 8, 2003. In the PiP configuration, the top package may be either oriented in the same direction as the bottom package (that is, with the die attach sides of both package substrates facing the same direction); or the top package may be inverted with respect to the bottom package (that is, with the die attach sides of the respective package substrates facing one another). Second-level interconnect solder balls are provided on the land side of the bottom package substrate for connection of the module with underlying circuitry such as, for example, a motherboard. In configurations where the top package is inverted, the z-interconnection wire bonds connect wire bond sites at the land side of the top substrate with peripherally arranged wire bond sites on the die attach side of the bottom package substrate. Where the top and bottom packages are oriented the same way, the z-interconnection wire bonds connect peripherally arranged wire bond sites at the die attach side of the top substrate with peripherally arranged wire bond sites at the die attach side of the bottom package substrate. In both configurations, the top package must be smaller (narrower and/or shorter by at least 0.5 mm on each margin that has z-interconnections) than the bottom package to accommodate the wire bond process.

The PoP module or PiP module is completed by overmolding, to entirely cover the top package and the wire bond interconnects between the packages. Once the module has been overmolded, no further integration can be made. That is, the designer has no flexibility to reconfigure the assembly at the product assembly level (that is, at the surface mount assembly floor); and the original equipment manufacturer cannot mix-and-match various packages from various suppliers to reduce costs.

SUMMARY

This invention is directed in one general aspect to Stacked CSP (chip scale package) modules including a molded first ("top") chip scale package having a molding side and a substrate side, and a second ("bottom") package affixed to the substrate side of the top chip scale package, the second package being electrically connected to the first package by wire bonding between the first and second package substrates. The invention provides for stacking and electrical interconnection ("z-interconnection") of chip scale packages and, in some embodiments, for stacking and electrical interconnection ("z-interconnection") of matrix molded and saw-singulated chip scale packages.

Also, this invention is directed to methods for making a stacked chip scale module including: providing a first ("top") chip scale package including at least one first package die affixed to and electrically interconnected with a die attach side of a first package substrate, the first CSP being molded and without solder balls; dispensing adhesive on the land side of the first package substrate; providing a singulated second ("bottom") package including at least one second package die affixed to and electrically interconnected with a die attach side of a second package substrate, the second package being molded and without solder balls; affixing the second package onto the land side of the first package substrate, a surface of the molding of the second package contacting the adhesive on the land side of the first package substrate; curing the adhesive; performing a plasma clean; forming wire bond interconnections between the land side of the second package substrate and sites in a marginal area of the land side of the first package substrate; performing a plasma clean; performing an operation to enclose the marginal areas of the land side of the first substrate, the z-interconnection wire bonds and wire loops, the edges of the second package, and the marginal area on the land side of the second package, leaving exposed an area of the land side of the second substrate located within a marginal area; attaching second level interconnect solder balls to sites on the exposed area of the second package substrate; and (where the first substrate was provided in a strip or array) saw singulating to complete a unit assembly. The exposed area of the land side of the second ("bottom) package substrate provides for second-level interconnection of the module with underlying circuitry, such as, for example, a motherboard.

On another general aspect the invention is directed to stacked CSP assemblies having first and second CSP stacked packages inverted and mounted onto and electrically interconnected with a module substrate. Z-interconnection of the first CSP package with the second CSP package, and of the CSP packages with the module substrate, are made by wire bonds connecting land sides of the respective CSP package substrates with the package attach side of the module substrate. The assembly is encapsulated in such a way that both the module substrate (at one side of the assembly) and a portion of the first CSP package substrate (at the opposite side of the assembly) are exposed, so that second level interconnection and interconnection with additional components may be made.

In some embodiments the first CSP package side of the assembly is the second level interconnect side; that is, second level interconnection of the assembly to underlying circuitry (such as, for example, a motherboard) is by solder balls (or other means of electrical connection) at lands on the exposed area on the land side of the first CSP substrate. The exposed land side of the module substrate is, accordingly, available for interconnection with additional components that may be stacked over the assembly. In further aspects, then, the invention features a stacked package assembly that has both a module substrate exposed at one side of the assembly and a portion of a first CSP package substrate exposed at the opposite side of the assembly, and that includes second level interconnection formed at the exposed portion of the CSP package substrate and interconnection with one or more additional components at the exposed LGA package substrate. In some embodiments the additional component includes one or more of: a ball grid array (BGA) package, which may be a stacked die BGA; or an additional LGA, which may be a stacked die LGA; or a quad flat package (QFP), which may be a stacked die quad flat package (SD QFP); or a quad flat nonleaded (QFN) package or lead frame chip scale package (LFCSP), which may be a stacked die quad flat package (SD QFN); or a wire bonded die (or a stack of wire bonded die) which may be overmolded; or a flip chip die; or an optical sensor package; or a micro-electro-mechanical sensor (MEMS) package; and the additional component may additionally include one or more passive devices. In some embodiments a heat spreader is mounted over the exposed land side of the module substrate.

In another general aspect of the invention the module substrate side of the assembly is the second level interconnect side; that is, second level interconnection of the assembly to underlying circuitry (such as, for example, a motherboard) is by solder balls (or other means of electrical connection) at lands on the exposed area on the land side of the module substrate. The exposed land side of the CSP substrate is, accordingly, available for interconnection with additional components that may be stacked over the assembly. In further aspects, then, the invention features a stacked package assembly that has both a module substrate exposed at one side of the assembly and a portion of a first CSP package substrate exposed at the opposite side of the assembly, and that includes second level interconnection formed at the exposed portion of the module substrate and interconnection with one or more additional components at the exposed CSP package substrate. In some embodiments the additional component includes one or more of: a ball grid array (BGA) package, which may be a stacked die BGA; or an additional LGA, which may be a stacked die LGA; or a quad flat package (QFP), which may be a stacked die quad flat package (SD QFP); or a quad flat nonleaded (QFN) package or lead frame chip scale package (LFCSP), which may be a stacked die quad flat package (SD QFN); or a wire bonded die (or a stack of wire bonded die) which may be overmolded; or a flip chip die; or an optical sensor package; or a micro-electro-mechanical sensor (MEMS) package; and the additional component may additionally include one or more passive devices. In some embodiments a heat spreader is mounted over the exposed land side of the first CSP package.

In some embodiments at least one of the first and second CSP packages is a stacked die package.

In some embodiments the first ("top") package is matrix molded and saw-singulated; in some embodiments the first package is cavity molded. In some embodiments the second ("bottom") package is matrix molded and saw-singulated; in some embodiments the second package is cavity molded.

The invention provides for excellent manufacturability, high design flexibility, and low cost to produce a stacked package module having a low profile and a small footprint.

The CSPs and other packages are standard in the industry, providing for selection of the lowest cost and the widest availability. This provides significant flexibility in selecting the packages to be stacked and, therefore, in the kinds of functions that can be integrated into the assembly.

A typical single wire-bonded die CSP thickness is 0.8 mm. The stacking of a second package on the land side of the substrate of a CSP according to the invention can be completed using an adhesive having a finished thickness in the range 10-50 microns. The footprint of the module according to the invention can be determined according to the maximum chip size of the stack. The wire bond z-interconnect generally requires that the bottom CSP be smaller than the second substrate, by about 0.5 mm to 1,0 mm, to accommodate the wires without shorting to the substrate metal edges. If the selected bottom CSP package is significantly smaller than the top substrate, wire bonding can accommodate size differences at least up to 8 mm or more. For a given selected CSP, accordingly, this allows for selection of a top substrate having a significantly larger footprint than the CSP. This provides significant flexibility for the designer, to choose additional components to be stacked over the assembly.

Package assemblies according to the invention can be used for building computers, telecommunications equipment, and consumer and industrial electronics devices.

DETAILED DESCRIPTION

Figure 1:
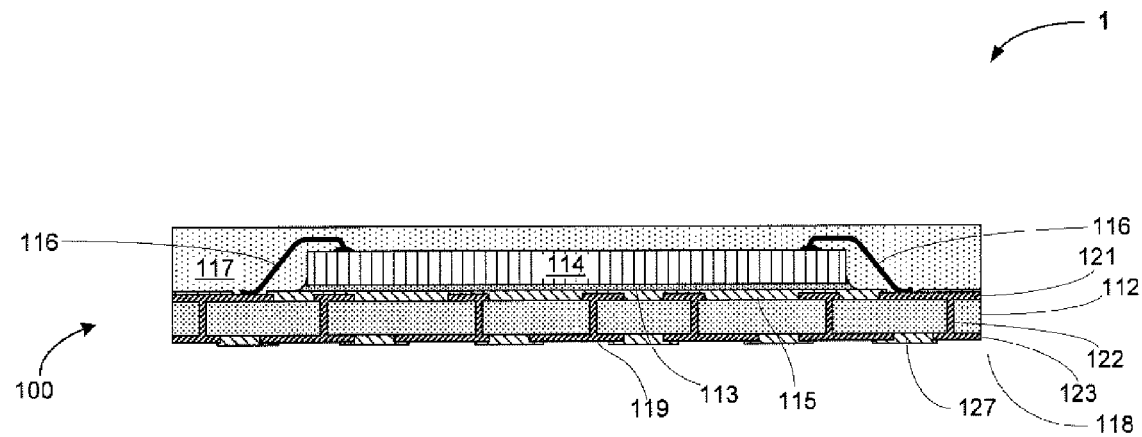
FIG. 1 is a diagrammatic sketch in a sectional view thru a CSP.

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly relabeled, although they are all readily identifiable in all the FIGS.

At some points herein, terms of relative orientation, such as "horizontal", "vertical", "on", "over", "under", "above", "below", "top", "bottom", "upper", "lower", and the like, may be used with reference to the relative orientation of features as shown in the drawings. As will be appreciated, the various assemblies according to the invention may in use or during processing be held in any orientation.

All patents and patent applications referred to herein, above or below, are incorporated by reference.

Turning now to FIG. 1, there is shown in a diagrammatic sectional view generally at 1 a chip scale package, matrix molded and saw singulated, without solder balls. The CSP 1 shown in FIG. 1 includes a die 114 attached onto a substrate 112 having at least one metal layer. Any of various substrate types may be used, including for example: a laminate with 2-6 metal layers, or a build up substrate with 4-8 metal layers, or a flexible polyimide tape with 1-2 metal layers, or a ceramic multilayer substrate. The substrate 112 shown by way of example in FIG. 1 has two metal layers 121, 123, each patterned to provide appropriate circuitry and connected by way of vias 122. The die is conventionally attached to a surface of the substrate using an adhesive, typically referred to as the die attach epoxy, shown at 113 in FIG. 1 and, in the configuration in FIG. 1, the side of the substrate onto which the die is attached (the "die attach" side) may be referred to as the "upper" side, and the metal layer on that side may be referred to as the "upper" metal layer, although the die attach side need not have any particular orientation in use.

In the CSP package of FIG. 1 the die is wire bonded onto wire bond sites on the upper metal layer of the substrate to establish electrical connections. The die 114 and the wire bonds 116 are encapsulated, in this example by matrix molding and saw singulation, with a molding compound 117 that provides protection from ambient and from mechanical stress to facilitate handling operations. Bonding pads 119 are provided on the lower metal layer 123 of the substrate 112, which may be employed for testing the package, or for second level interconnection of the package to other features or to the underlying circuitry of, for example, a motherboard (not shown in the FIGS.). Solder masks 115, 127 are patterned over the metal layers 121, 123 to expose the underlying metal at bonding sites for electrical connection, for example the wire bond sites and bonding pads for bonding the wire bonds 116 and other features, or solder balls for second-level interconnection.

Second level interconnect ball pads 119 provide for attachment of the CSP to underlying circuitry, such as a motherboard.

Figure 2:
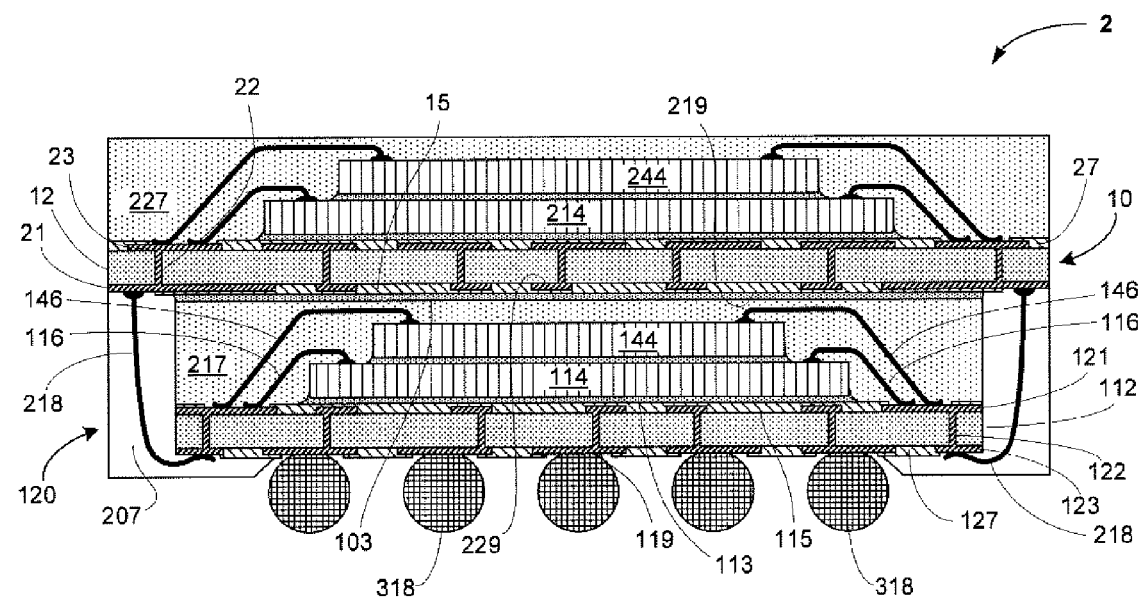
FIG. 2 is a diagrammatic sketch in a sectional view thru an embodiment of a semiconductor assembly according to an aspect of the invention.

FIG. 2 is a diagrammatic sectional view showing a stacked CSP module according to the invention, generally at 2. Here a "bottom" CSP 120 is a stacked die CSP, having die 114 and 144 affixed onto a die attach side of a CSP substrate 112, using adhesives to attach the first die to the substrate and to attach the second die to the first die. The die are electrically interconnected to the substrate by wire binds 116, 146. The die 114, 144 and the wire bonds 116, 146 are encapsulated, by matrix molding and saw singulation, with a molding compound 117 that provides protection from ambient and from mechanical stress to facilitate handling operations, and provides a bottom package upper surface 229 onto which the second ("top") package can be stacked.

Referring still to FIG. 2, the second ("top") package is a similarly constructed matrix molded and saw singulated CSP 10 including a substrate 12 having a first side and a second side, and at least one metal layer, and die 244 and 214 stacked upon and wire bonded to substrate 12. The substrate 12 shown by way of example in FIG. 2 has two metal layers 21, 23, each patterned to provide appropriate circuitry and connected by way of vias 22. The side of the second substrate that faces the first package is the assembly is referred to as the "land" side.

In the second package substrate 12 in the embodiment of FIG. 2 solder masks 15, 27 are patterned over the metal layers 21, 23 to expose the underlying metal at bonding sites for electrical connection, for example the wire bond sites for bonding the wire bonds 118.

The z-interconnect between the top package 10 and the bottom package 120 is made by way of wire bonds 218 connecting traces on the downward facing metal layer (the metal layer 21) of the top substrate with traces on the lower metal layer 123 of the bottom package substrate. At one end each wire bond 118 is electrically connected to downward facing surfaces of pads on the metal layer 21 of the top substrate 12, and at the other end each wire bond is connected to lower surfaces of pads on the lower metal layer 123 of the bottom package substrate 112. The wire bonds may be formed by any wire bonding technique, well known in the art, such as is described, for example, in U.S. Pat. No. 5,226,5821 which is hereby incorporated by reference herein. The package-to-package z-interconnect wire bonds are shown by way of example in FIG. 2 as having been made by forming a bead or bump on the surface of a pad on the lower metal layer of the top substrate, and then drawing the wire toward, and fusing it onto, a pad on the lower metal layer of the bottom substrate. As will be appreciated, the wire bonds can be made in the inverse direction, that is, by forming a bead or bump on the lower surface of a pad on the lower metal layer of the bottom substrate, and then drawing the wire toward, and fusing it onto, a pad on the metal layer of the top substrate. As will be appreciated, selection of a wire bonding strategy for the package-to-package z-interconnection will be determined according to the geometric arrangements of the margins of the stacked substrates and of the bonding surfaces on them. Also, as will be appreciated, in conventional wire bonding equipment the wire bond capillary strikes downward onto upwardly oriented bond pads and, accordingly, the assembly will be inverted according to the invention for the wire bonding procedure at least.

As pointed out above, the top package substrate is larger than the surface of the first package mold cap on which it is mounted, leaving an area at the periphery of the first side of the top package substrate on which the bond pads are exposed for the wire bonds 118. The top substrate is (typically later) punch- or saw-singulated.

The bottom package, is (in the example shown in FIG. 2) matrix molded and saw singulated (to provide vertical walls for the molding, as shown in FIG. 2), so that the die attach side of the bottom package substrate is covered by the molding. Bond pads in the upper metal layer at the die attach side of the bottom package substrate are connected to the die by wire bonds, and the upper metal layer is connected to the lower metal layer at the land side of the bottom package substrate through vias to the die attach side of the substrate, and the lower metal layer at the land side of the bottom package substrate is patterned to provide peripherally arranged bond pads for connection with the z-interconnection wires 118.

The structure according to the invention allows for pretesting of the CSPs before assembly into the assembly, to permit rejection of nonconforming packages prior to assembly, and thereby to assure high final module test yields.

In the stacked package embodiment of FIG. 2, the z-interconnect pads on the respective package substrates are arranged on metal layers near the margins of the package substrates. The location and order of the z-interconnect pads are generally arranged so that the z-interconnect pads on the top package substrate approximately overlie the corresponding z-interconnect pads on the bottom package when the packages are stacked. Conveniently, the top substrate 10 has a larger substrate footprint than that of the bottom package 120, to allow clearance for the wire bonds without electrical shorting to the edges of the metal layers of the substrates.

Once the z-interconnect wire bonds have been formed connecting the stacked first package and the second substrate, an assembly encapsulation 207 is formed, to enclose and protect the z-interconnect wire bonds and to provide mechanical integrity to the completed assembly. The assembly encapsulation 207 covers the marginal area of the downward-facing land side of the top package substrate, and encloses the z-interconnection wire bonds and wire loops and the vertical walls and edges of the bottom package, and covers the marginal area of the land side of the bottom package substrate including the wire loops and the wire bond pads to which the wire bonds are connected. This leaves an area of the land side of the bottom package substrate exposed for second-level interconnection. Referring to FIG. 2, solder balls 318 are reflowed onto bonding pads 119 on the exposed area of the lower metal layer of the substrate to provide interconnection to underlying circuitry of, for example, a motherboard (not shown in the FIGS.) of a final product, such as a computer.

As shown by way of example in FIG. 2 the module may itself be saw-singulated, alternatively, the module may be individually molded rather than saw-singulated.

As may be appreciated, the CSP packages may have flip chip, rather than wire bonding, interconnection of the die to the first package substrate.

Figure 5A:
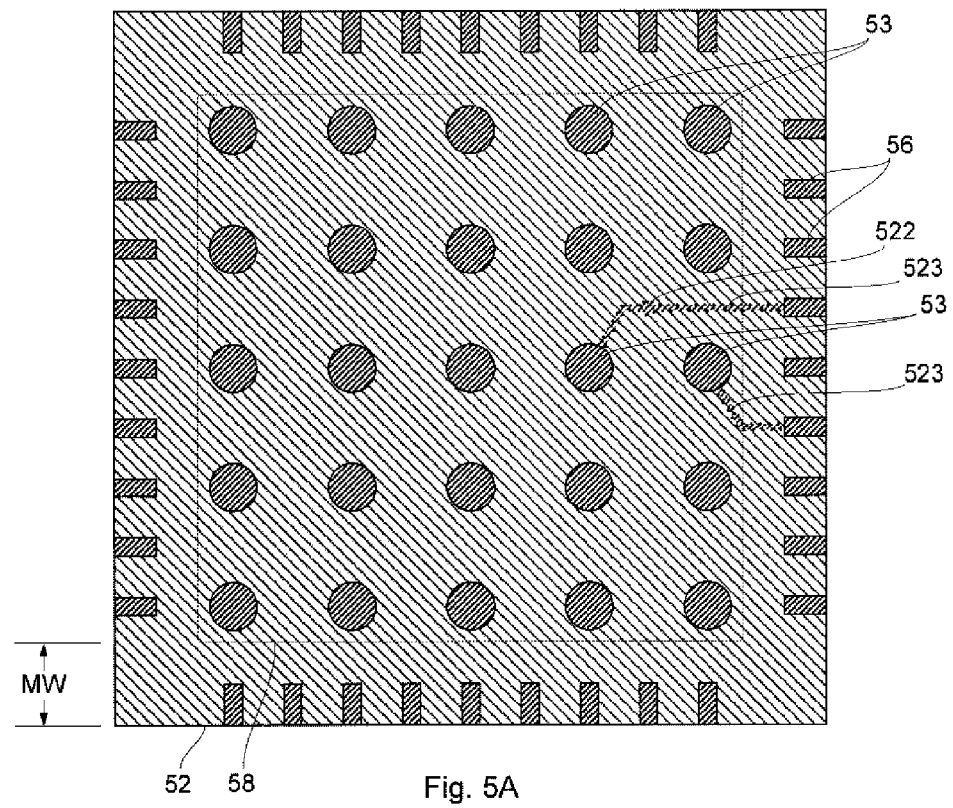
FIG. 5A is a diagrammatic sketch in a plan view showing the land side of a bottom CSP substrate according to an embodiment of the invention in an arrangement suitable for use in an embodiment of the invention as shown in FIG. 3.
Figure 5B:
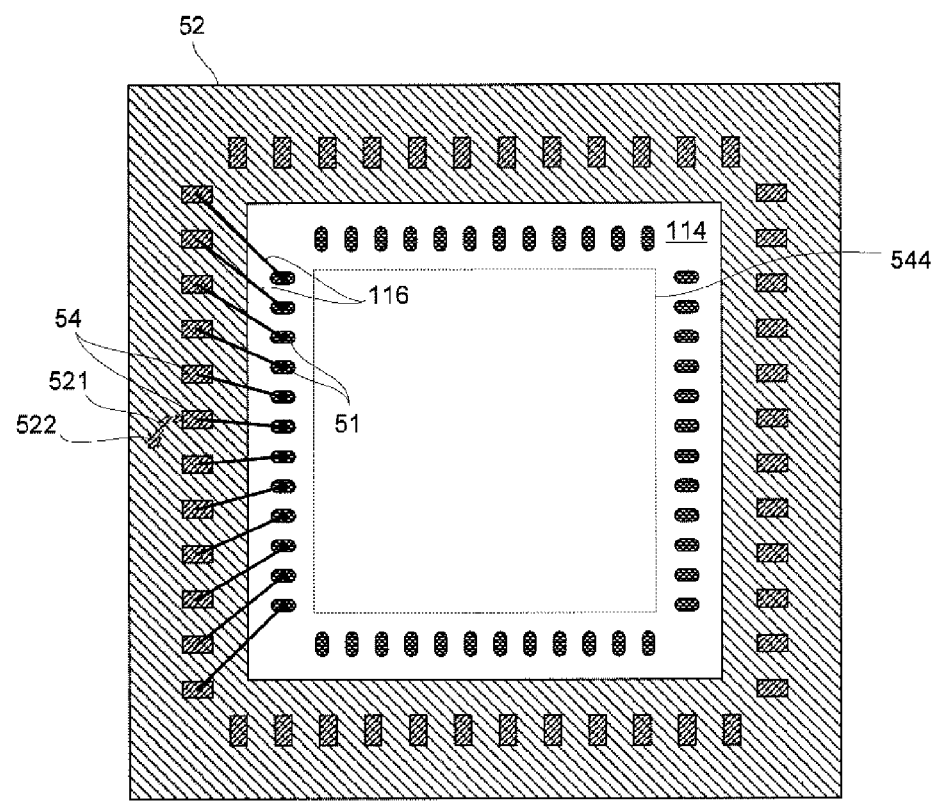
FIG. 5B is a diagrammatic sketch in a plan view showing the die attach side, with die attached, of a CSP substrate according to an embodiment of the invention in an arrangement suitable for use in an embodiment of the invention as shown in FIG. 3.

FIGS. 5A and 5B are diagrammatic sketches in plan view showing the land side and the die attach side, respectively, of a suitable first package substrate as illustrated at 112 in FIG. 2. Referring to FIG. 5A, most of the surface of the land side is covered by the solder mask, which obscures the patterned metal layer beneath except where sites on the metal layer are revealed by openings in the solder mask. Openings in the solder mask reveal sites in the patterned metal layer at the land side of the substrate, including ball pads (e.g., 53) arrayed in a middle region of the substrate surface, and bond fingers (e.g., 56), arranged in a marginal area near the edge 52 of the substrate. Obscured by the solder mask are traces (e.g., 523) in the metal layer which variously connect the ball pads 53 and the bond fingers 56, and/or connect ball pads 53 with vias (e.g., 522) which electrically connect traces in the patterned metal layer at the land side of the substrate with traces in the patterned metal layer at the die attach side of the substrate.

As described above, the assembly encapsulation covers the bond pads 56 and the wire loops formed at the pads 56; the encapsulation is limited at the land side of the substrate to a marginal area, indicated in FIG. 5A by the broken line 58, so the region of the land side of the first package substrate bounded by the marginal encapsulation, that is, within the broken line 58, is left exposed following formation of the assembly molding. Accordingly, the ball pads 63 are available for attachment, for example, of solder balls for z-level interconnection of the assembly to underlying circuitry (as illustrated for example in FIG. 3). The ball pads 53 are additionally available as test probe sites for testing the package prior to assembly, or for testing the package assembly, if desired, prior to mounting the second level interconnect solder balls, The encapsulated marginal area has a width (MW in FIG. 5A) determined by the sum of the lengths of the bond fingers, the length of the trace to the bond finger, and the width of the saw street. Additionally, some mold flash may appear on the substrate surface at the inner edge of the margin (at the broken line 58 in FIG. 5A). Where the substrate is provided as one in a strip or array, some substrate material at the edge is lost to the saw width during saw singulation of the first package. Typically the bond finger length is about 250 um, the finger trace length is about 50 um, and an allowance for mold resin bleed can be about 500 um. The saw typically consumes about 50 um.

As a practical matter the number and arrangement of the ball pads 53 depend upon the nominal ball diameter, as the balls must not contact each other, or be too close together, when collapsed. Also as a practical matter the size and proximity of the ball pads 53 are limited by limits of resolution in fabricating the traces and, particularly, the solder mask openings. In a typical example the ball pads are generally circular with a diameter about 280 um, and are arranged in a square or rectangular array at a center-to-center distance about 500 um. (The distance between nearest edges of adjacent solder mask openings is typically not less than about 0.20 times the center-to-center distance.)

The die attach side of the first package substrate, with die attached, is illustrated in FIG. 5B. The first die 114 is affixed, active side upward, onto the die attach side of the substrate. In this example, the die has four edges defining a square. Wire bond pads 51 are arranged in rows near the four edges of the die. As on the land side of the substrate, most of the surface of the die attach side is covered by a solder mask, except where sites on the metal layer are revealed by openings in the solder mask, including particularly rows (one row along each edge of the die, in this example) of bond fingers (e.g., 54). Wires 116 connect the die pads 51 with the bond fingers 54. Obscured by the solder mask are traces (e.g., 521) in the metal layer connecting bond fingers 54 to vias (e.g., 522) which electrically connect traces in the patterned metal layer at the die attach side of the substrate with traces in the patterned metal layer at the land side. Accordingly, the first package die is connected by way of the wires to traces in the metal layer on the die attach side of the first package substrate, and by way of vias to traces and to z-interconnect wire bond fingers in the metal layer on the land side. The z-interconnect wires connect the bond fingers on the land side of the first package substrate to bond fingers on the die attach side of the second package substrate. The footprint of the second die 144 is indicated in FIG. 5B by the broken line 544.

The substrate of the top package 10 can be similar to that shown in FIGS. 5A and 5B.

Figure 3:
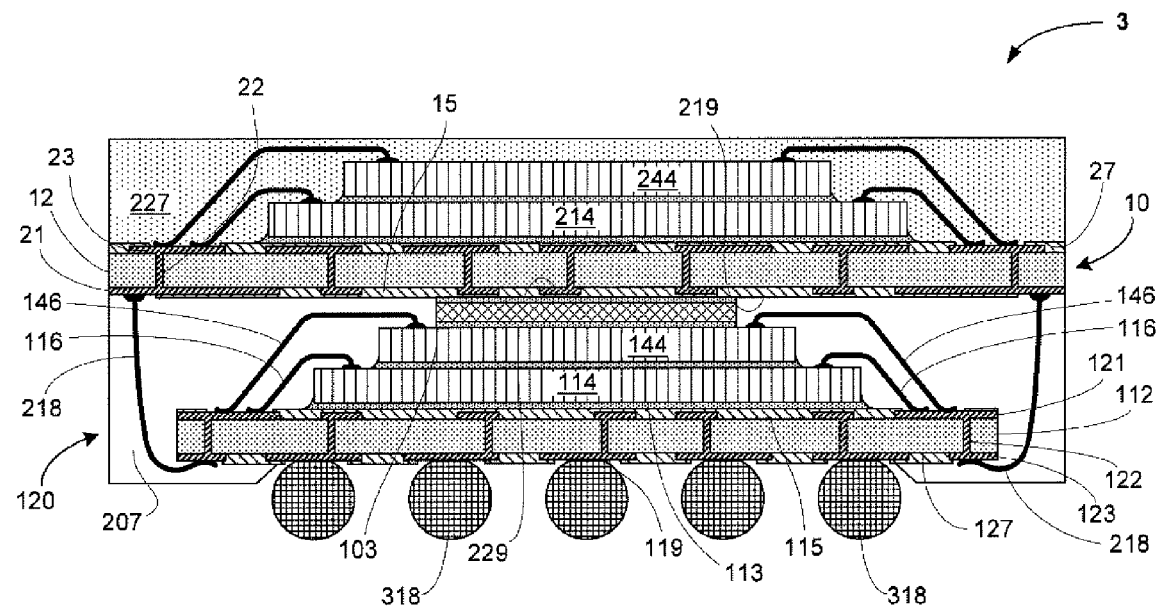
FIG. 3 is a diagrammatic sketch in a sectional view thru an embodiment of a semiconductor assembly according to another aspect of the invention.

As FIG. 3 shows, the bottom stacked die and substrate need not be encapsulated. Where the bottom package die are wire bonded to the substrate, a spacer must be provided to prevent interference of the top substrate with the wire bonds of the bottom die.

Figure 4:
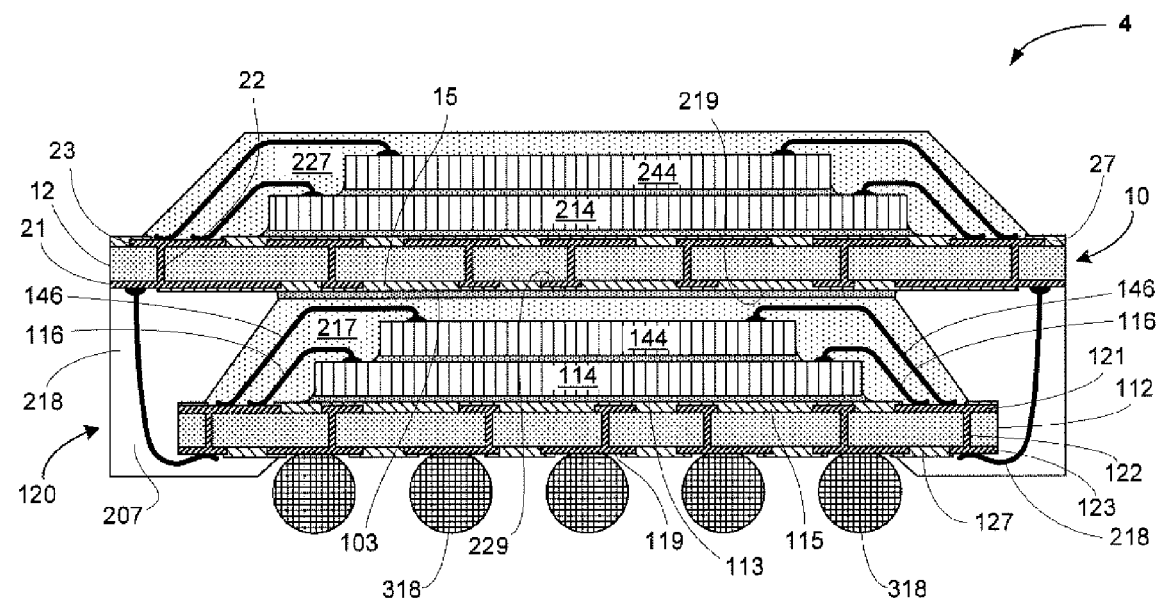
FIG. 4 is a diagrammatic sketch in a sectional view thru an embodiment of a semiconductor assembly according to another aspect of the invention.

As FIG. 4 shows, one of the bottom of top package, or both the bottom and top packages (as shown in the FIG.) can be cavity molded rather than matrix molded and saw singulated.

As suggested in the FIGS., the second package substrate necessarily has a larger footprint than the first package substrate, to accommodate the z-interconnection between the package substrates. In the examples shown, z-interconnects are arranged along all four edges of the packages and, accordingly, the second package is both wider and longer than the first package. As may be appreciated, in some assemblies according to the invention, z-interconnection may be made between bond fingers on fewer than all four edges, as for example along only one edge, or along two opposite edges. In such embodiments (unless a larger die in the second substrate requires a larger footprint), the second package need be larger (longer or wider) than the first package only in one direction.

The first and second packages may have any of a variety of functionalities. For example, the CSP package can be a DSP, ASIC, GPU; and the LGA package can be a memory, such as Flash, DRAM, SRAM.

The processor chip in a flip chip bottom package according to this aspect of the invention can be, for example, an ASIC, or a GPU, or a CPU, often an ASIC; and the top package can be, for example, a processor chip or, for example, a memory package or an ASIC package. Where the top package is a memory package it can be a stacked die memory package. A shielded flip chip die-up bottom package can be particularly suitable for higher speed applications, particularly for RF frequency processing, as in mobile communications applications.

The first package may have any of a variety of functionalities. For example, the CSP package can be a DSP, ASIC, GPU; or, the CSP package can be a memory, such as Flash, DRAM, SRAM.

The processor chip in a flip chip bottom package according to this aspect of the invention can be, for example, an ASIC, or a GPU, or a CPU, often an ASIC. Where the bottom package is a memory package it can be a stacked die memory package. A shielded flip chip die-up bottom package can be particularly suitable for higher speed applications, particularly for RF frequency processing, as in mobile communications applications.

Figure 6:
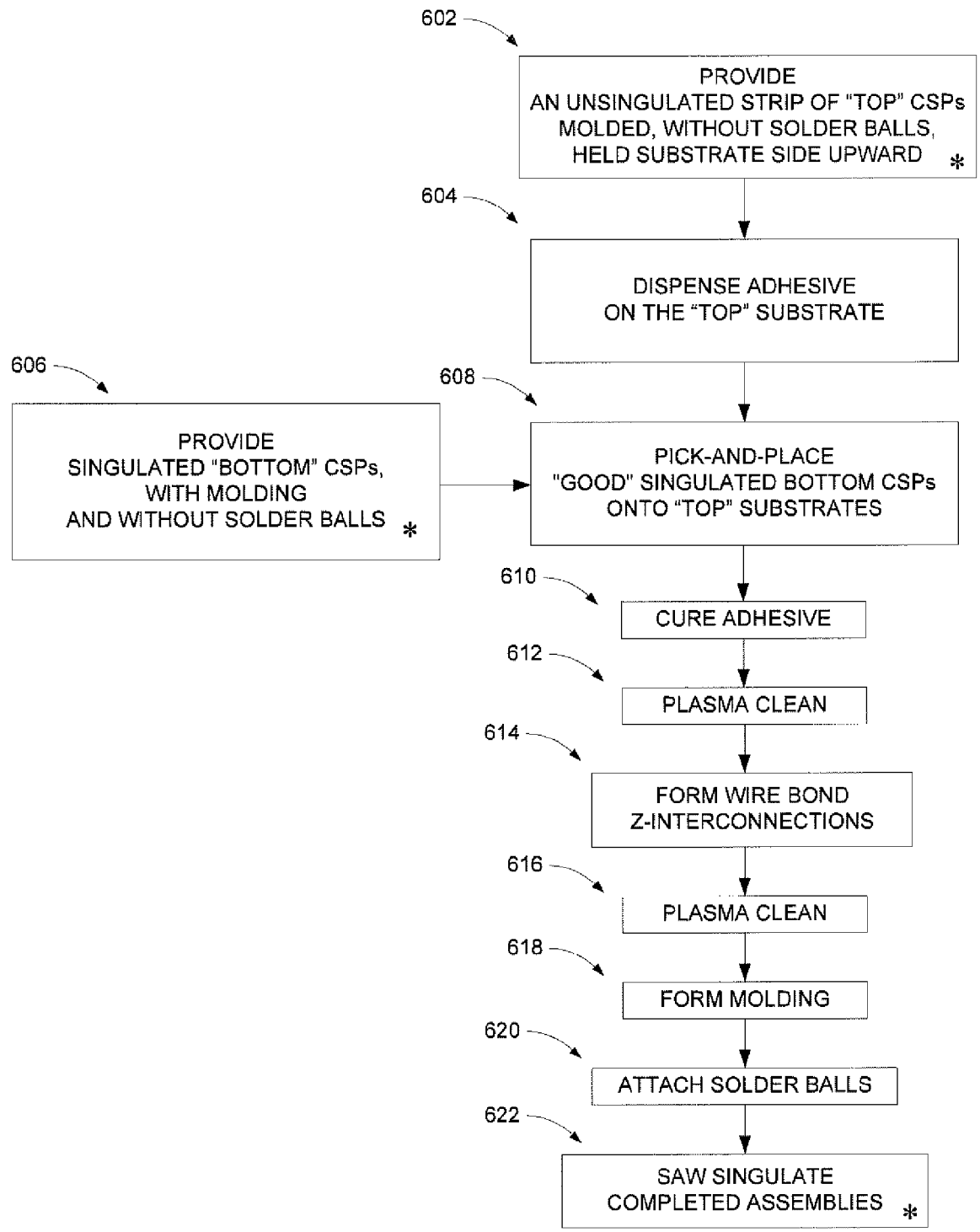
FIG. 6 is a diagram showing steps in a process for making a semiconductor assembly according to an embodiment of the invention.

FIG. 6 is a flow diagram showing steps in a process for making an assembly as in FIG. 2. In a step 602, a "first" CSP is provided, usually as an unsingulated strip of "first" CSPs. In a step 604 an adhesive is dispensed (e.g., printed, or provided as an adhesive film) onto the exposed land side of the "first" CSP substrate. In a step 606 a "second" CSP is provided, and in a step 608, using a pick-and-place tool the "second" CSP is affixed onto the "first" CSP. As will be appreciated, the adhesive may alternatively be dispensed onto the molding or encapsulation surface of the "second" CSP rather than on the land side of the "first" CSP substrate. In a step 610, the adhesive is at least partly cured, and in a step 612 a plasma clean removes accumulated debris and contamination from the previous operations, to prepare bonding surfaces for wire bonding, which is carried out in a step 614 to provide z-interconnection between bond fingers on the land sides of the first and second CSP substrates. This is followed in a step 616 by a further plasma clean, to provide uncontaminated surfaces for the molding or encapsulation, which is carried out in a step 618. Then second-level interconnect solder balls are reflowed onto the ball pads on the exposed part of the land side of the first CSP substrate, and the packages are singulated by sawing or punching, in steps 620, 622.

Figure 7:
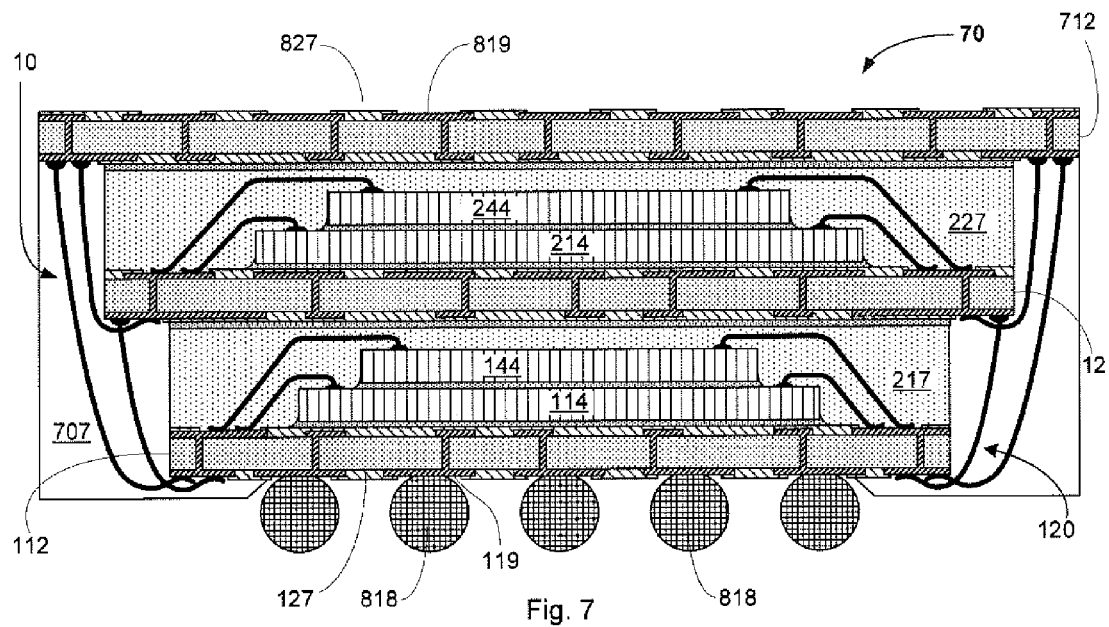
FIG. 7 is a diagrammatic sketch in a sectional view thru an embodiment of a semiconductor assembly according to another aspect of the invention.
Figure 8:
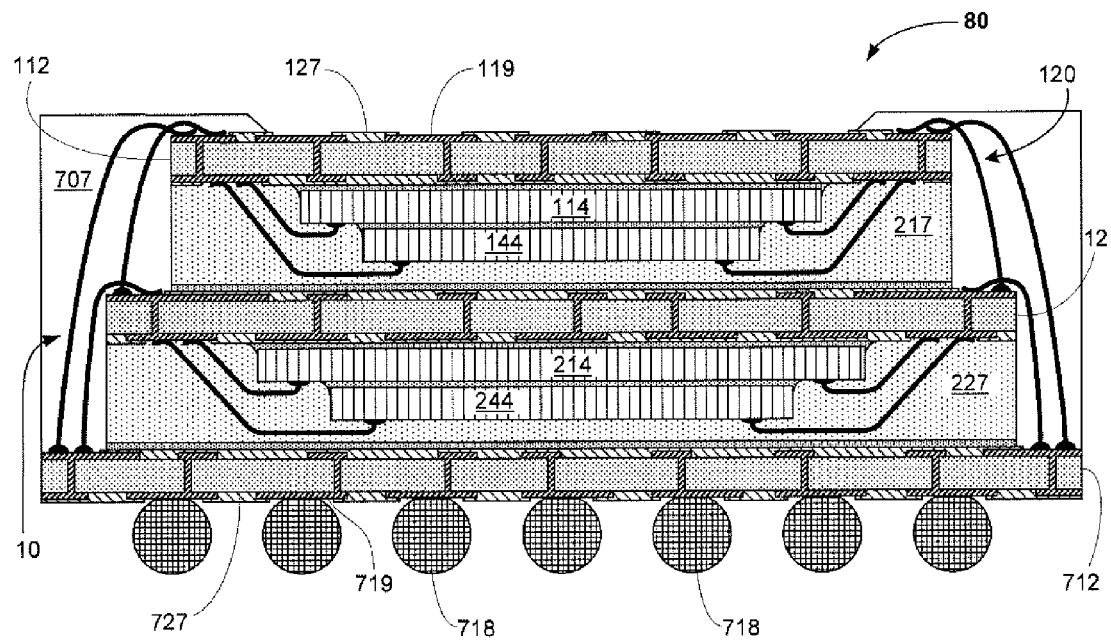
FIG. 8 is a diagrammatic sketch in a sectional view thru an embodiment of a semiconductor assembly according to another aspect of the invention.

FIGS. 7 and 8 illustrate examples of CSP package modules having stacked CSPs and substrates exposed on both sides of the module, for interconnection of additional devices or for second-level interconnection to underlying circuitry.

In the modules according to the invention, a "first" CSP 10 is mounted onto a package attach side of the module substrate 712, and a "second" CSP 120 is mounted onto the surface of the molding or encapsulation on the "first" CSP package. The "second" package is electrically connected to the "first" package by wire bonds connecting bond fingers on the margins of the land sides of the respective CSP package substrates; and/or the "second" package is connected to the module substrate by wire bonds connecting bond fingers on the margin of the land side of the "second" CSP package substrate with bond fingers or bond pads on the package attach side of the module substrate; and/or the "first" CSP package is electrically connected with the module substrate by wire bonds connecting bond fingers on the margin of the land side of the "first" CSP package substrate with bond fingers or bond pads on the package attach side of the module substrate.

Referring to FIG. 7, once the z-interconnect wire bonds have been formed connecting the stacked first and second packages, an assembly encapsulation 707 is formed, to enclose and protect the z-interconnect wire bonds and to provide mechanical integrity to the completed module. The assembly encapsulation 707 covers the marginal area of the package attach side of the module substrate, and encloses the z-interconnection wire bonds and wire loops and the vertical walls and edges of the "first" and "second" CSP packages, and covers the marginal area of the land side of the "second" package substrate including the wire loops and the wire bond pads to which the wire bonds are connected. This leaves an area of the land side of the "second" package substrate exposed for second-level interconnection. Stated another way, a cavity is formed in the assembly encapsulation on the second package side, leaving an inboard area of the land side of the second package substrate exposed (unencapsulated). Referring to FIG. 7, solder balls 818 are reflowed onto bonding pads 119 on the lower metal layer of the substrate within the cavity in the encapsulation to provide interconnection to underlying circuitry of, for example, a motherboard (not shown in the FIGS.) of a final product, such as a computer. As described in further detail below, additional packages or die can be mounted upon and electrically connected with the land side of the module substrate.

As shown by way of example in the FIGS., the module assembly may itself be saw-singulated, or, alternatively, the module assembly may be individually molded rather than saw-singulated.

As may be appreciated, either or both the first and second packages may have flip chip, rather than wire bonding, interconnection of the die to the respective package substrates.

Either the first package or the second package, or both packages, may be a stacked die package.

In an alternative embodiment, the exposed side of the module substrate 712 provides for second-level interconnection. By way of example, the embodiment shown in FIG. 8 has second level interconnect solder balls 718 mounted onto pads 719 on the exposed metal layer, for connection of the assembly to underlying circuitry such as a motherboard. In embodiments such as these, the exposed portion of the "second" package substrate is available for stacking additional components such as packages, die, or passive devices. In such embodiments, a greater area is available on the land side of the second package substrate for second-level interconnects; on the other hand, the exposed portion of the second package substrate has a more limited area than the module substrate, limiting the number of interconnections that can be made at the second package side. Moreover, the part of the assembly molding 707 that covers the marginal area of the land side of the second package substrate must be thick enough to accommodate the loop height of the z-interconnection wire bonds (plus a tolerance). Typically the thickness of the molding at the wire loops is in the range about 50 um to about 200 um. Where reverse wire bonding is employed, so that an end of the wire loop is stitched onto the pads on the land side of the first package, the wire loop height in practice may be as little as about 35 um and, accordingly, a molding thickness over the marginal area of as little as about 100 um can be achieved in such embodiments. A greater mold height will be required where forward wire bonding is employed, as the wire loop height over a ball (or bump) as more usually about 100 um or greater using currently available wire bonding techniques forming wire having about 1 mil thickness.

Figure 11:
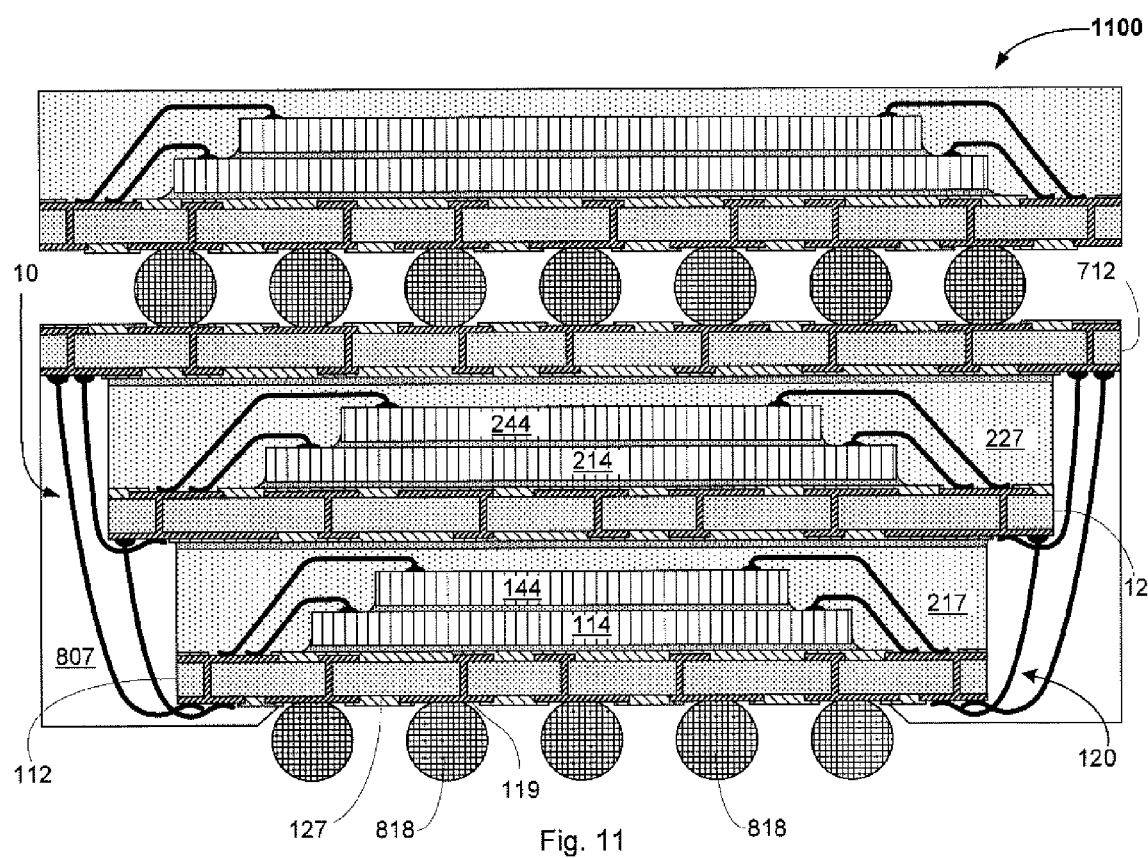
Figure 13:
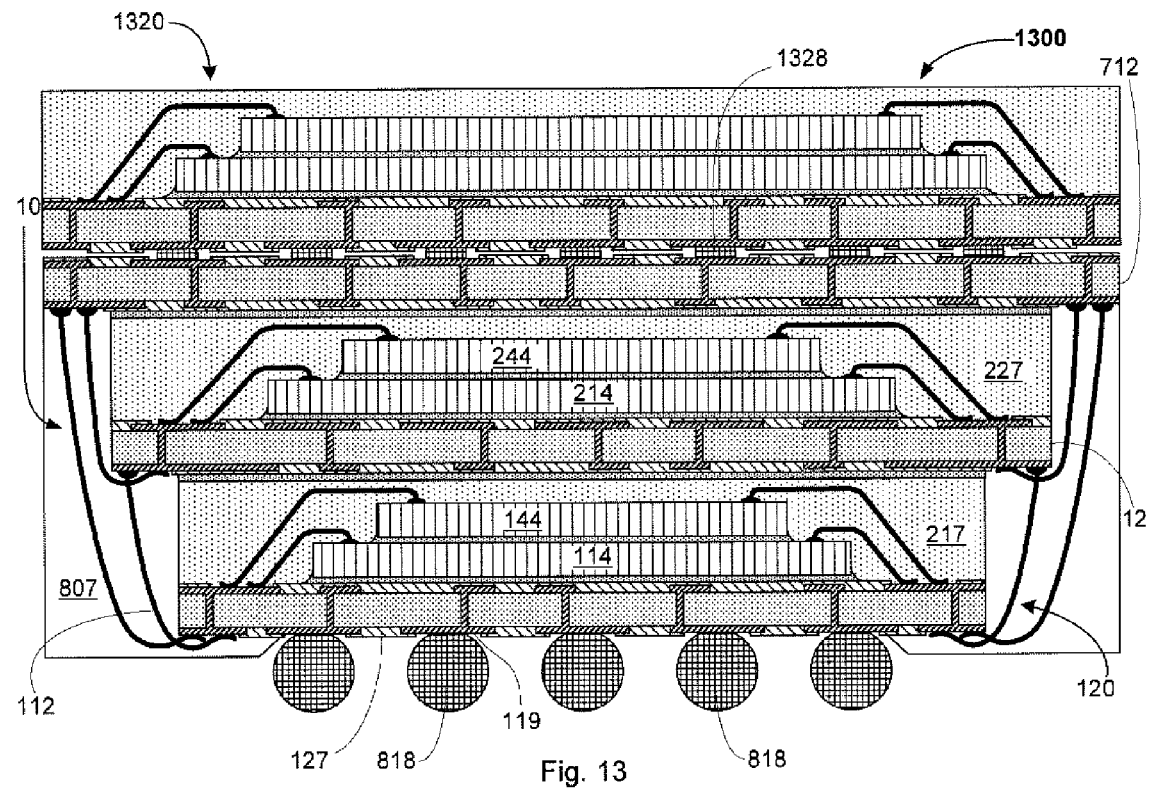

This in effect raises a low wall around the exposed region of the first package substrate, and this can limit the dimensions and configuration of devices that may be stacked upon the land side of the first package substrate. Embodiments as shown for example in FIG. 7, in which the second level interconnection is made at the exposed region of the land side of the second package substrate, permit stacking of much larger additional components over the assembly, as shown in FIGS. 11 and 13, for example.

Figure 20:
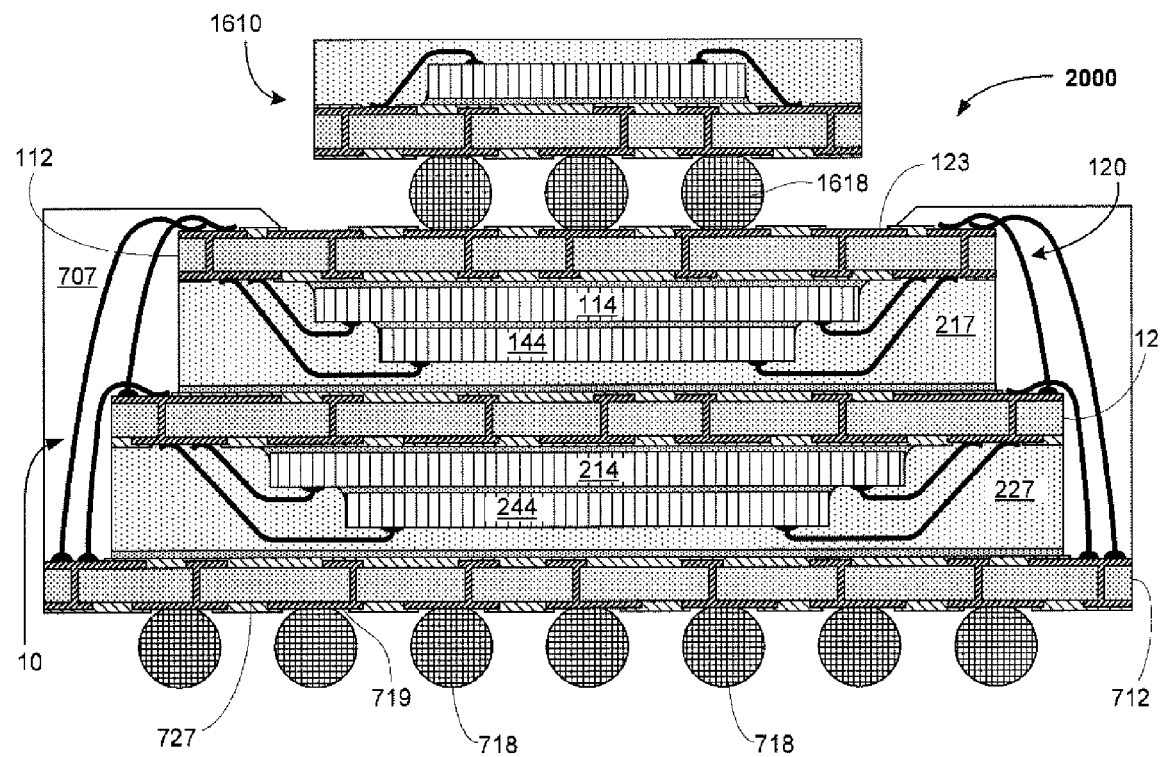
FIG. 20 is a diagrammatic sketch in a sectional view thru a stacked package assembly according to an embodiment of the invention, including a BGA stacked over an assembly according to an embodiment of the invention as shown in FIG. 8.
Figure 21:
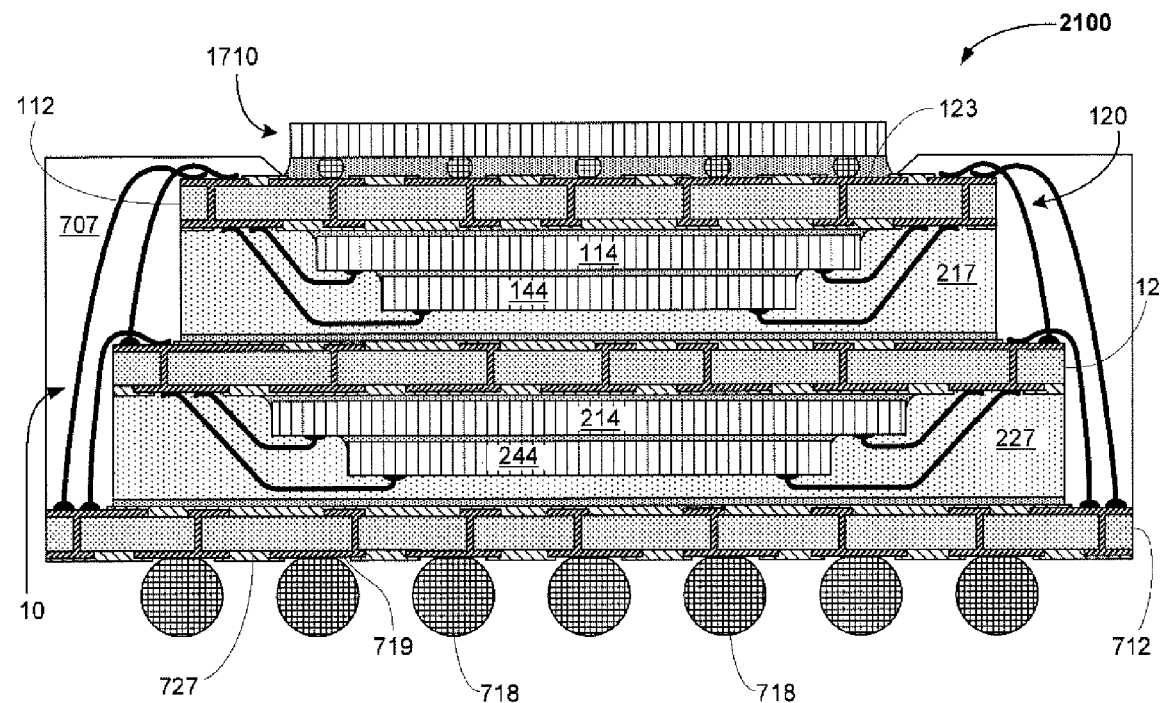
FIG. 21 is a diagrammatic sketch in a sectional view thru a stacked package assembly according to an embodiment of the invention, including a flip chip die mounted over an assembly according to an embodiment of the invention as shown in FIG. 8.

Embodiments as shown for example in FIG. 8, in which the second level interconnection is made at the land side of the module substrate, are shown in FIGS. 20 and 21, for example. As described in further detail below, one or more additional components can be mounted upon and electrically connected with, the land side of the second package substrate within the cavity in the encapsulation.

Figure 9A:
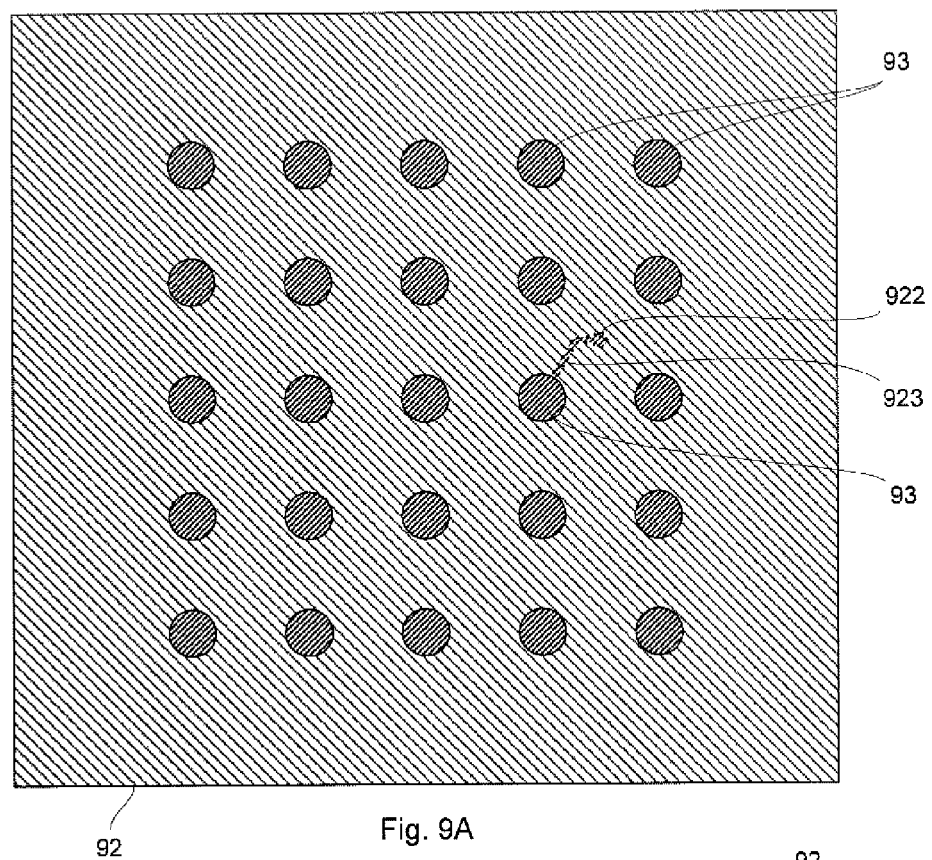
FIG. 9A is a diagrammatic sketch in a plan view showing the land side of a module substrate suitable for use in an embodiment of the invention as in FIG. 7.
Figure 9B:
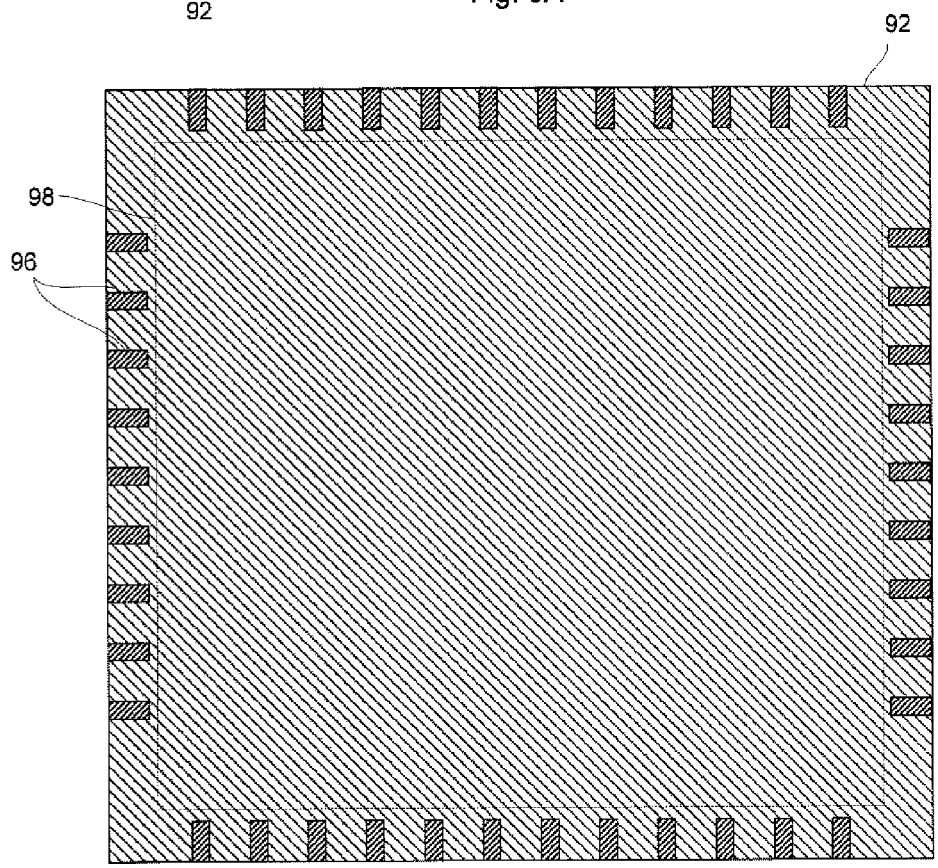
FIG. 9B is a diagrammatic sketch in a plan view showing the package attach side of a module substrate suitable for use in an embodiment of the invention as in FIG. 7.

FIGS. 9A and 9B are diagrammatic sketches in plan view showing the land side and the package attach side, respectively, of a suitable module substrate as illustrated at 712 in FIGS. 7 and 8. Referring to FIG. 9A, most of the surface of the land side is covered by the solder mask, which obscures the patterned metal layer beneath except where sites on the metal layer are revealed by openings in the solder mask. Openings in the solder mask reveal sites in the patterned metal layer at the land side of the substrate, including particularly ball pads (e.g., 93) arrayed in a middle region of the substrate surface. Obscured by the solder mask are traces (e.g., 923) in the metal layer which variously connect the ball pads 53 with vias (e.g., 922) which electrically connect traces in the patterned metal layer at the land side of the substrate with traces in the patterned metal layer at the package attach side of the substrate.

As a practical matter the number and arrangement of the ball pads 53 depend upon the nominal ball diameter, as the balls must not contact each other, or be too close together, when collapsed. Also as a practical matter the size and proximity of the ball pads 53 are limited by limits of resolution in fabricating the traces and particularly, the solder mask openings. In a typical example the ball pads are generally circular with a diameter about 280 um, and are arranged in a square or rectangular array at a center-to-center distance about 500 um. (The distance between nearest edges of adjacent solder mask openings is typically not less than about 0.20 times the center-to-center distance.)

The package attach side of the first package substrate is illustrated in FIG. 9B. The "first" CSP package (not shown in this view) is affixed onto the package attach side of the substrate. In this example, the package has four edges defining a square; the footprint is shown by the broken line 98. Wire bond pads 96 are arranged in rows near the four edges of the package footprint. As on the land side of the substrate, most of the surface of the die attach side is covered by a solder mask, except where sites on the metal layer are revealed by openings in the solder mask. Obscured by the solder mask are traces in the metal layer connecting the bond pads 96 to vias which electrically connect traces in the patterned metal layer at the package attach side of the module substrate with traces in the patterned metal layer at the land side. Accordingly, the "first" CSP package is connected by way of the wires to traces in the metal layer on the package attach side of the module substrate, and by way of vias to traces and to z-interconnect wire bond fingers in the metal layer on the land side.

Accordingly, in some configurations according to the invention, one or more additional features or devices such as a package, or a die, or a passive component, is attached to the assembly on an available (exposed) substrate surface.

In some embodiments the additional package is attached to the assembly on the exposed land side of the module substrate. In such embodiments the assembly as shown for example in FIGS. 7 or 8 can provide a useful platform upon which to stack components having additional functionalities, as shown for example in FIGS. 10 through 19. Because the second package substrate is fully exposed, it can accommodate any of a variety of component (die or package) configurations and sizes, and all that is required for compatibility of the assembly with the components is that the traces on the exposed second package substrate be suitably routed to accept the additional component.

Figure 10:
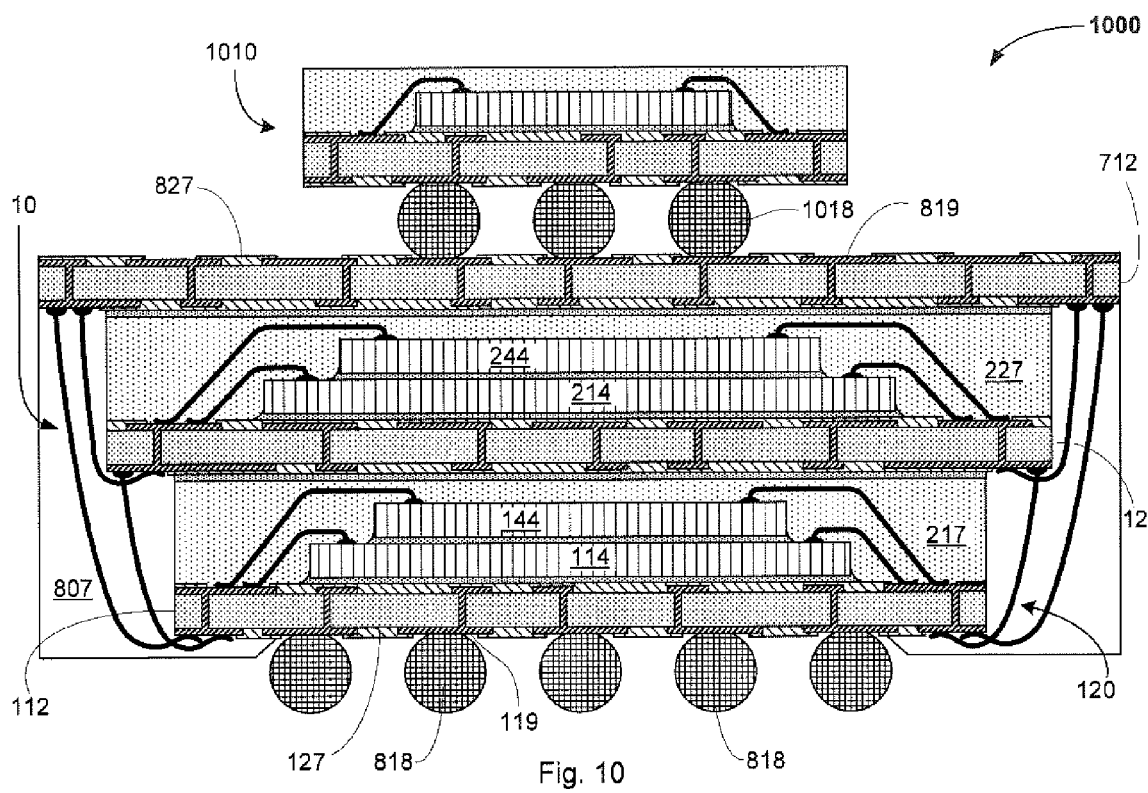
FIGS. 10 and 11 are diagrammatic sketches in a sectional view thru a semiconductor assembly according to embodiments of the invention, each including a BGA stacked over an assembly as shown in FIG. 7.

For example, as shown in FIGS. 10 and 11 a ball grid array (BGA) package can be mounted over an assembly constructed as described above with reference to FIG. 7. In FIG. 10, a BGA package 1010 having interconnect solder balls 1018 is aligned with and mounted upon the land side of a module substrate 712, and the solder balls are reflowed onto ball pads in the metal layer on the land side of the substrate 712 to form a module 1000. Here the BGA footprint is smaller than that of the assembly; in the module 1100 shown in FIG. 11, the footprint of the BGA is larger than that of the assembly, and the ball array has more interconnect solder balls, which accordingly occupy more ball pads on the module substrate 712. Also, in the example of FIG. 11, the BGA is a stacked die package, while in FIG. 10 the BGA is a single die package.

Figure 12:
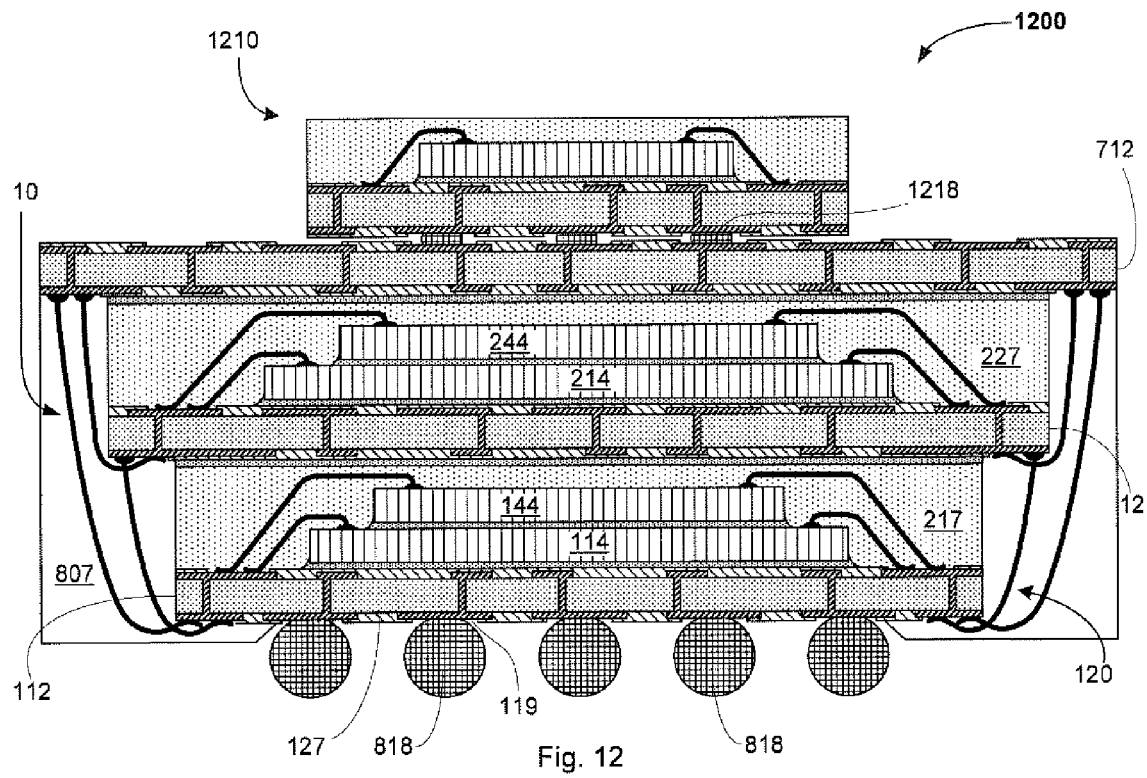
FIGS. 12 and 13 are diagrammatic sketches in a sectional view thru a semiconductor assembly according to embodiments of the invention, each including a LGA stacked over an assembly as shown in FIG. 7.

And for example, as shown in FIGS. 12 and 13 an additional land grid array (LGA) package can be mounted over an assembly constructed as described above with reference to FIG. 7. In FIG. 12, a LGA package 1210 having land interconnects 1218 is aligned with and mounted upon the land side of a module substrate 712, and the land interconnects are reflowed onto pads in the metal layer on the land side of the substrate to form a module 1200. Here the LGA footprint is smaller than that of the assembly; in the module 1300 shown in FIG. 13, the footprint of the LGA 1320 is larger than that of the assembly, and the array has more land interconnects, which accordingly occupy more pads on the package substrate 712. Also, in the example of FIG. 13, the LGA is a stacked die package, while in FIG. 12 the LGA is a single die package.

A configuration having a larger additional package mounted over the stacked package assembly as shown in FIGS. 12 and 13 may, for example, include processors in the first and second packages, and a memory package as the additional package 1210 or 1320. The footprints of the respective CSPs 100 in the assembly are determined principally by the dimensions of the die in the respective packages, and this generally relates to the functionality of the die. ASICs may be comparatively very small, for example, and different processors may be of significantly different sizes. Memory die, on the other hand, may be comparatively large. A digital signal processor (DSP) package, for example, has a footprint typically in the range 12×12 mm to 16×16 mm. A memory package, on the other hand, for example, typically has a footprint in the range 8×10 mm to 18×18 mm. Accordingly, if the assembly as in FIG. 7 includes a DSP in the first or the second DSP of the assembly, establishing a footprint of 16×16 mm for the assembly, the manufacturer may according to the specifications of the customer select either a smaller LGA memory package (e.g. 1210 in FIG. 12, giving a module 1200) or a larger LGA memory package (e.g. 1320 in FIG. 13, giving a module 1300). Thus, for embodiments as in FIGS. 10, 11, 12, 13, the manufacturer can mix-and-match assembly platforms with selected memory BGAs or LGAs according to function (memory capacity and speed; memory type) and according to costs from various suppliers.

Figure 14:
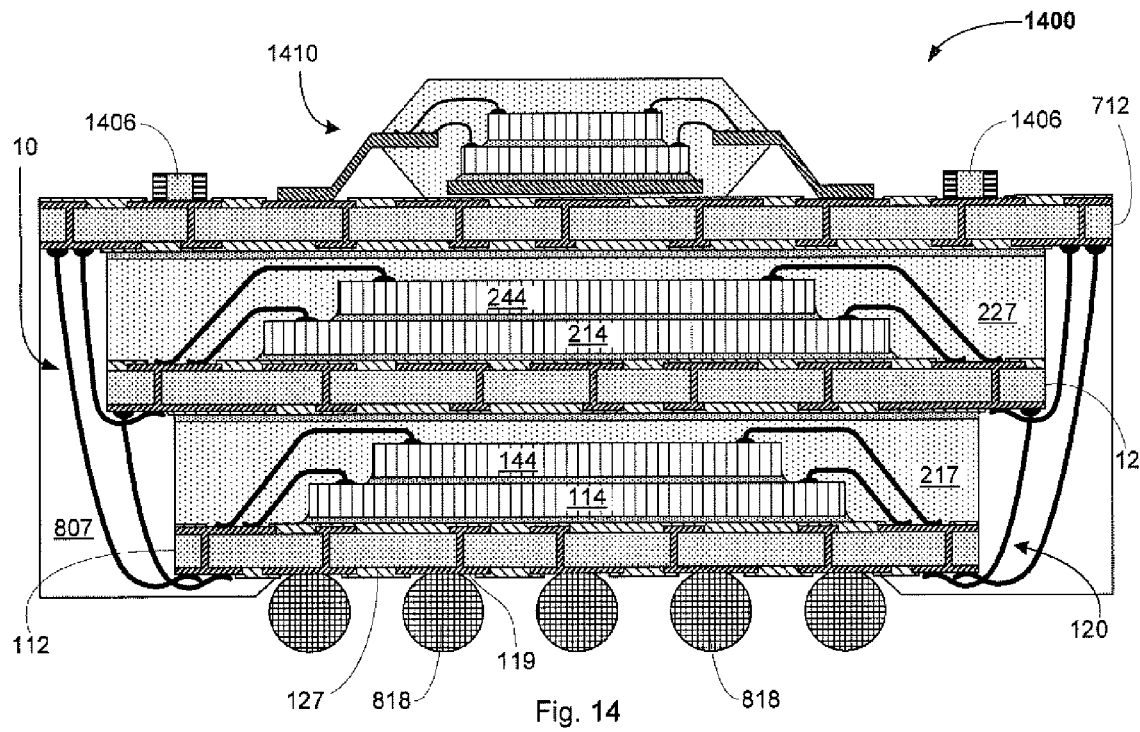
FIG. 14 is a diagrammatic sketch in a sectional view thru a stacked package assembly according to an embodiment of the invention, including a SD QFP stacked over an assembly according to an embodiment of the invention as shown in FIG. 7.
Figure 15:
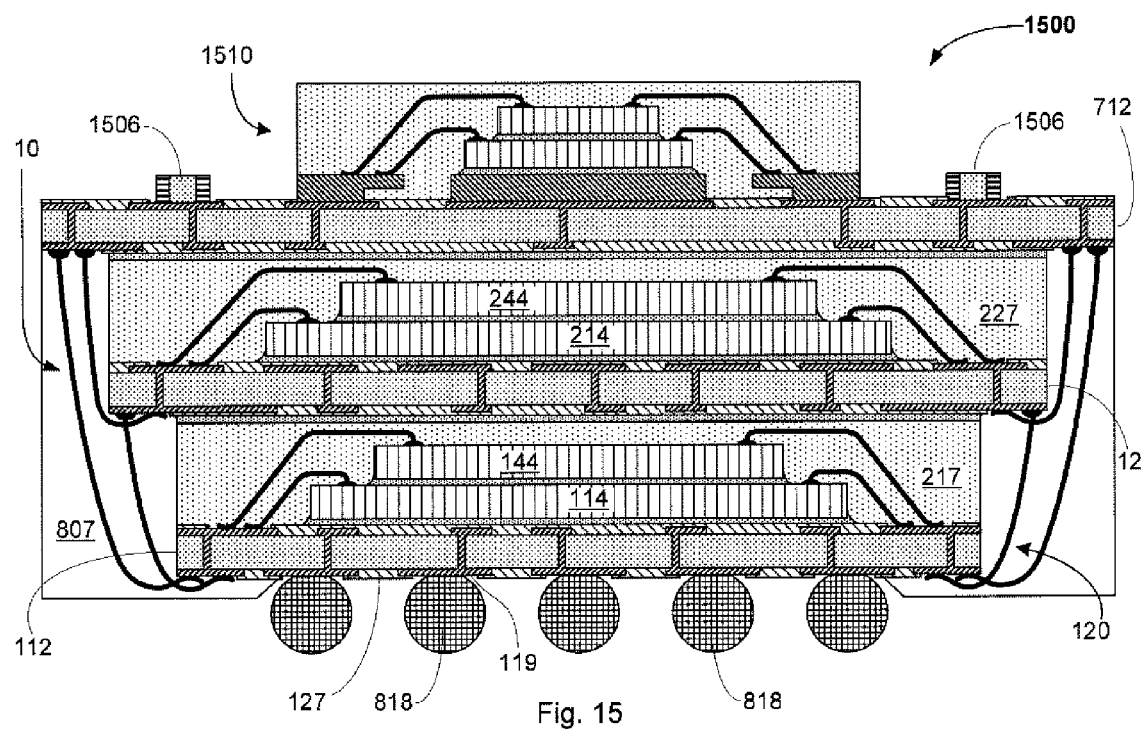
FIG. 15 is a diagrammatic sketch in a sectional view thru a stacked package assembly according to an embodiment of the invention, including a SD QFN/LFCSP stacked over an assembly according to an embodiment of the invention as shown in FIG. 7.
Figure 16:
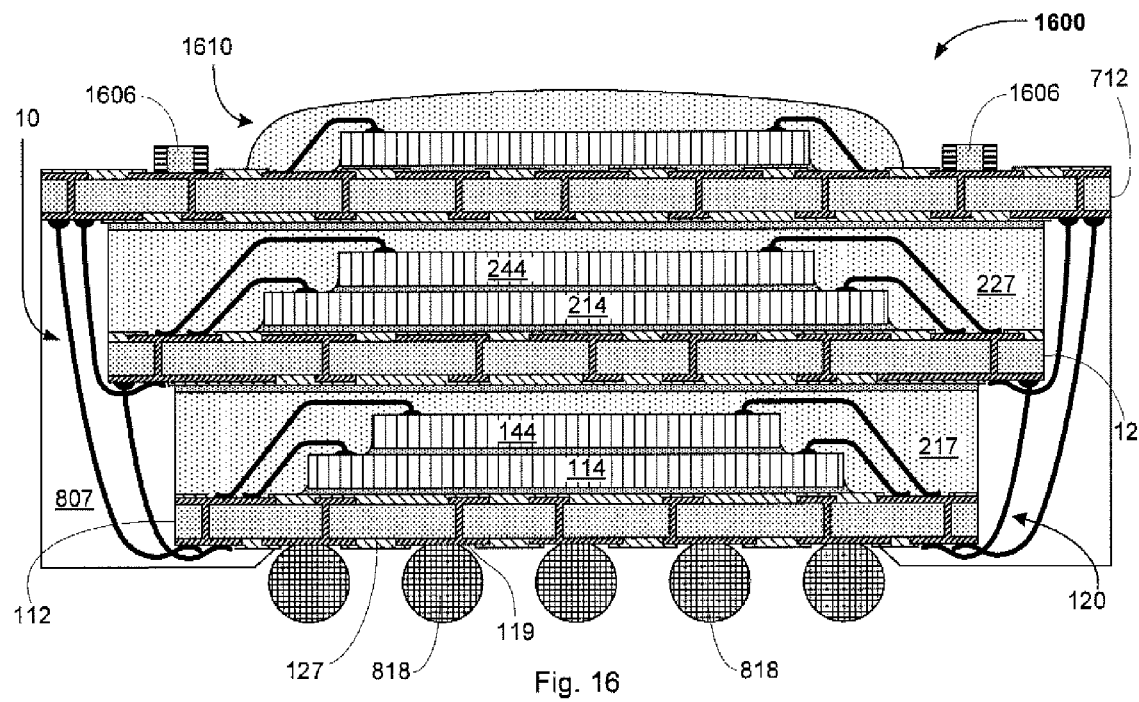
FIG. 16 is a diagrammatic sketch in a sectional view thru a stacked package assembly according to an embodiment of the invention, including a wire bonded die stacked over an assembly according to an embodiment of the invention as shown in FIG. 7.
Figure 17:
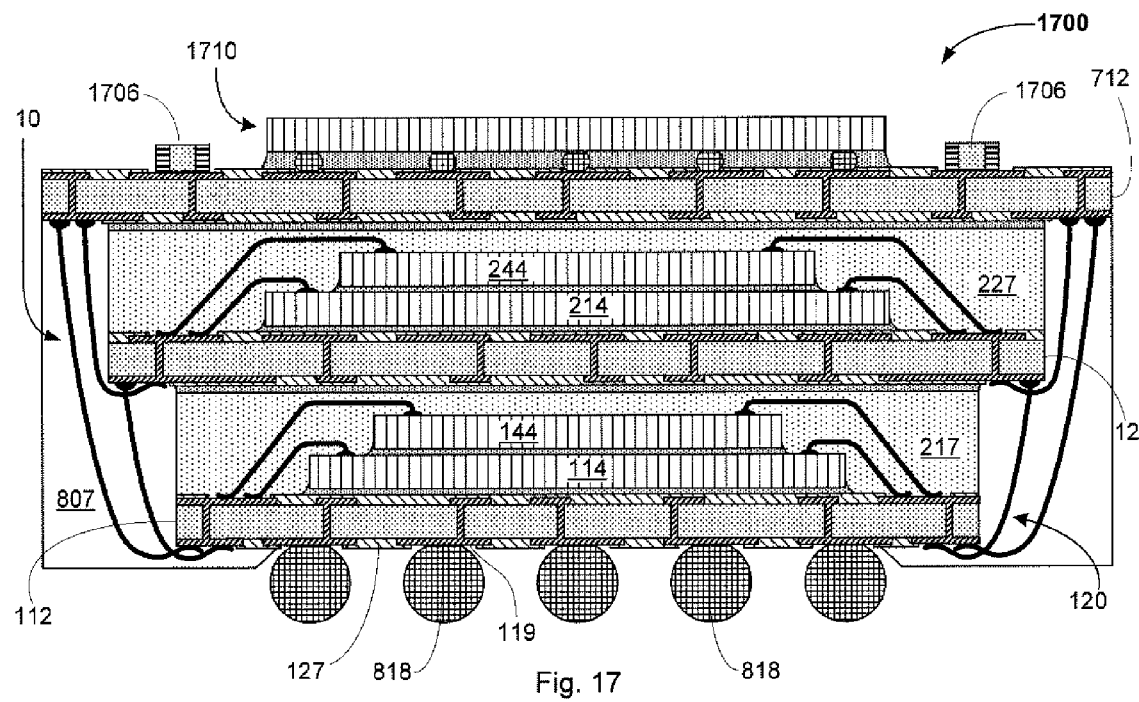
FIG. 17 is a diagrammatic sketch in a sectional view thru a stacked package assembly according to an embodiment of the invention, including a flip chip die stacked over an assembly according to an embodiment of the invention as shown in FIG. 7.
Figure 18:
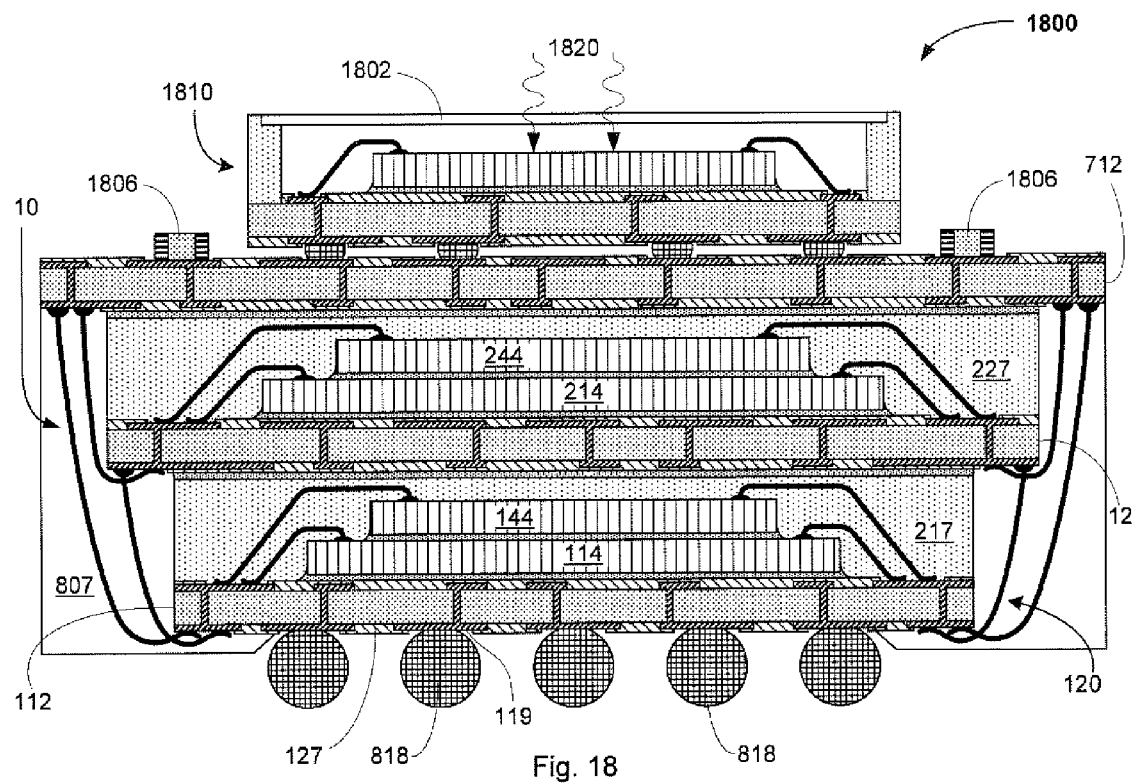
FIG. 18 is a diagrammatic sketch in a sectional view thru a stacked package assembly according to an embodiment of the invention, including an optical sensor package stacked over an assembly according to an embodiment of the invention as shown in FIG. 7.

Other additional components or devices can be mounted over the assembly, requiring only that the land side of the second package substrate be suitably routed to accept electrical interconnections from the component. FIG. 14 shows a module 1400 having a stacked die quad flat package 1410, accompanied by passive devices 1406, mounted over a stacked package assembly constructed generally as in FIG. 7. FIG. 15 shows a module 1500 having a stacked die quad flat nonleaded lead frame chip scale package 1510, accompanied by passive devices 1506, mounted over a stacked package assembly constructed generally as in FIG. 7. FIG. 16 shows a module 1600 having a wire bonded die 1610, accompanied by passive devices 1606, mounted over a stacked package assembly constructed generally as in FIG. 7; the die and wires are covered by a so-called "glop top" encapsulation, formed by syringe dispensing an encapsulating resin. FIG. 17 shows a module 1700 having a flip chip mounted die 1710, accompanied by passive devices 1706, mounted over a stacked package assembly constructed generally as in FIG. 7; an underfill protects the flip chip interconnects. FIG. 18 shows a module 1800 having an optical sensor package 1810, which may be an image forming device, accompanied by passive devices 1806, mounted over a stacked package assembly constructed generally as in FIG. 7; light passes through a transparent cover or lens 1802 as indicated by arrows 1820 to reach the active side of the wire-bonded light sensor die.

Figure 19:
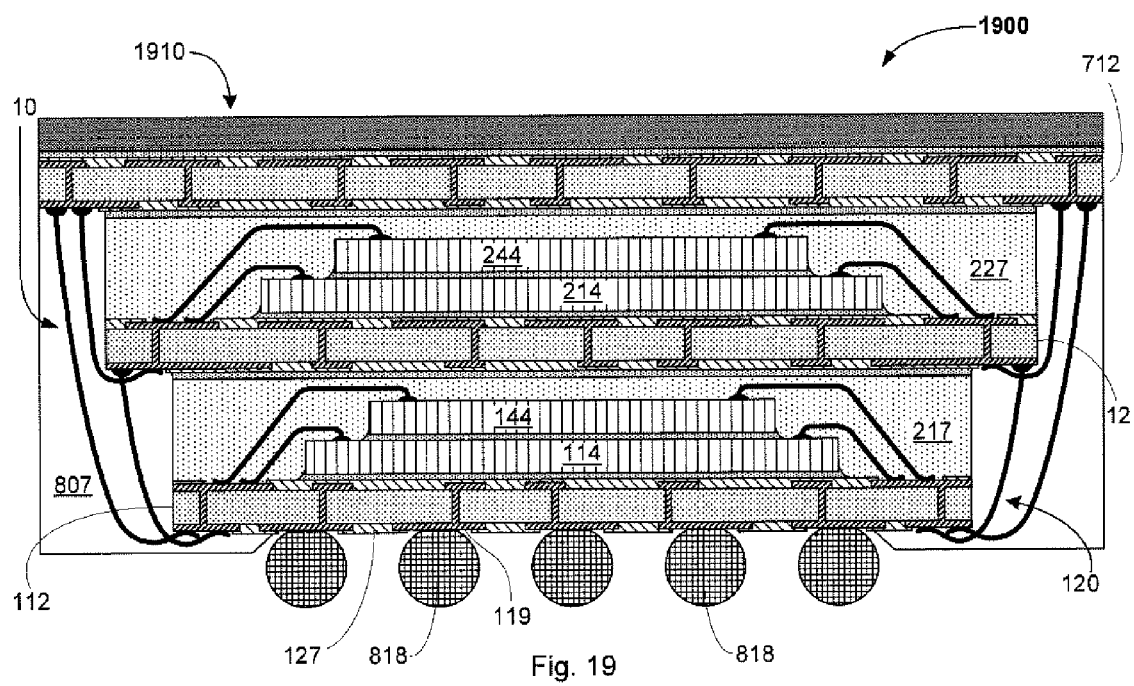
FIG. 19 is a diagrammatic sketch in a sectional view thru a stacked package assembly according to an embodiment of the invention, including a heat spreader stacked over an assembly according to an embodiment of the invention as shown in FIG. 7.

FIG. 19 shows an assembly 1900, including a stacked package assembly generally as shown in FIG. 7, having a heat spreader 1910 mounted upon the land side of the second package substrate.

In other embodiments the additional package is attached to the assembly on the exposed area of the land side of the first package substrate, in the cavity in the assembly encapsulation. In these embodiments the assembly as shown in FIG. 8, can provide a useful platform upon which to stack components having additional functionalities, as shown for example in FIGS. 20 through 27. In embodiments employing the platform of FIG. 8, the traces on the first package substrate must suitably routed to accept the additional component.

Figure 22:
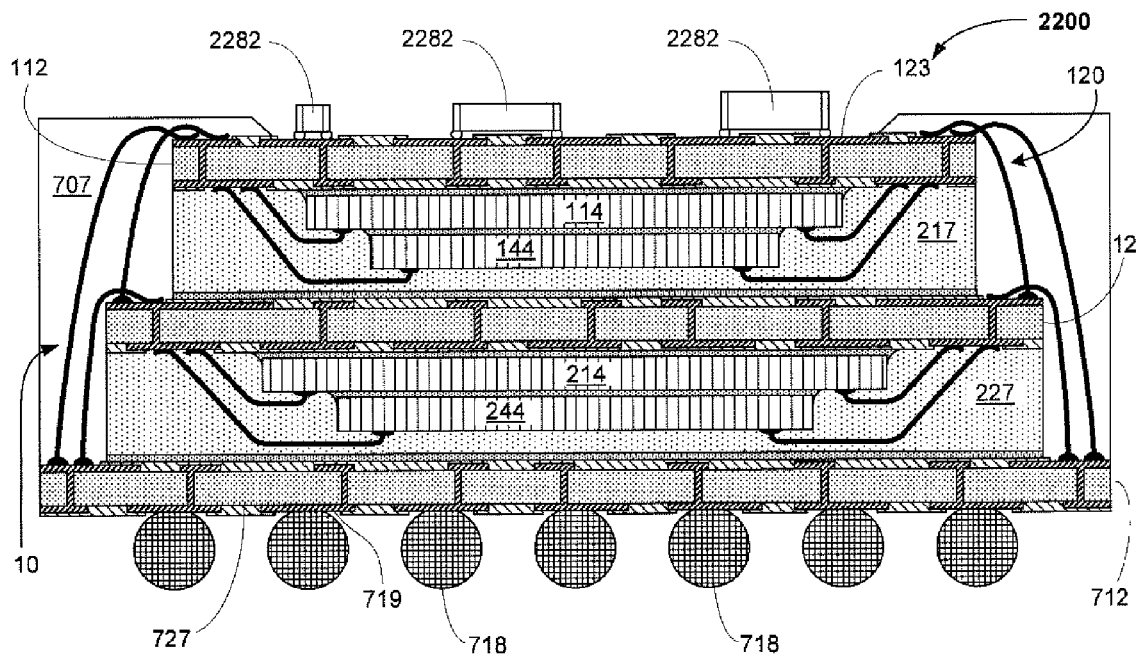
FIG. 22 is a diagrammatic sketch in a sectional view thru a stacked package assembly according to an embodiment of the invention, including passive devices mounted over an assembly according to an embodiment of the invention as shown in FIG. 8.
Figure 23:
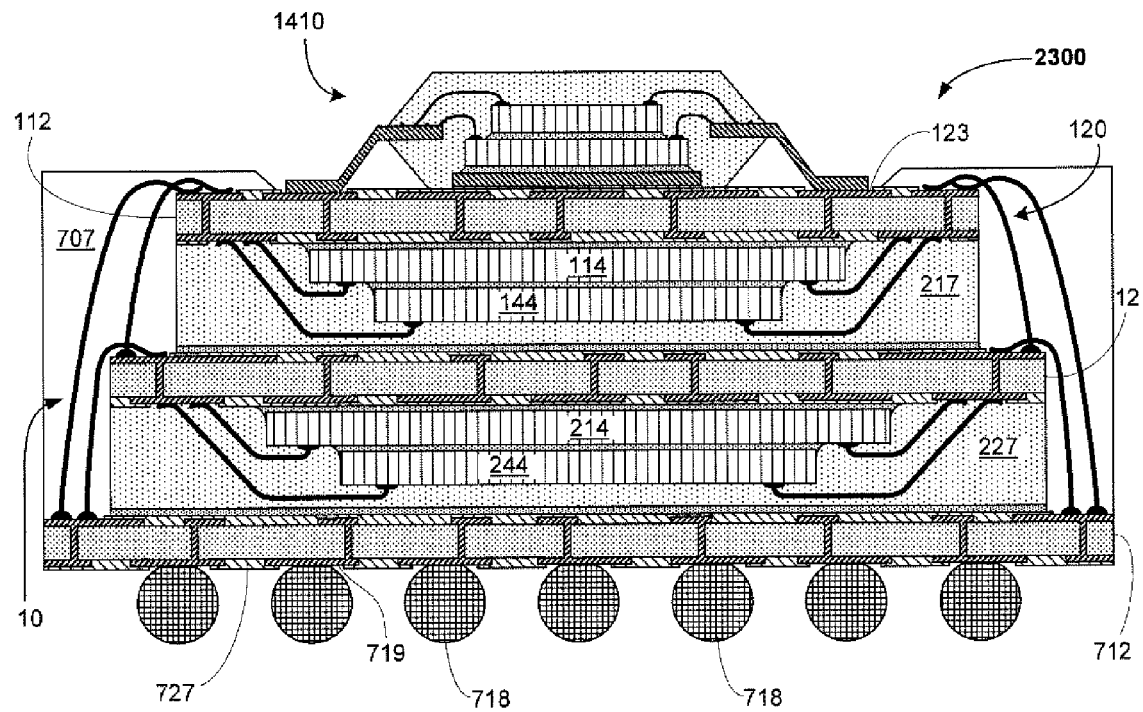
FIG. 23 is a diagrammatic sketch in a sectional view thru a stacked package assembly according to an embodiment of the invention, including a SD QFP stacked over an assembly according to an embodiment of the invention as shown in FIG. 8.
Figure 24:
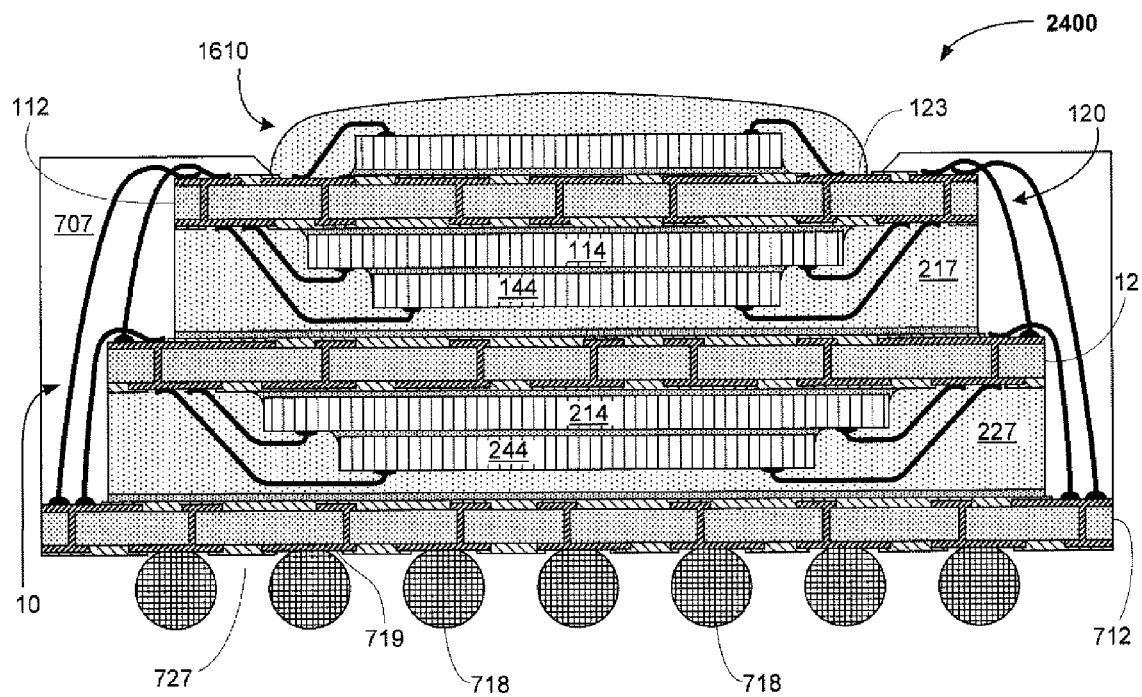
FIG. 24 is a diagrammatic sketch in a sectional view thru a stacked package assembly according to an embodiment of the invention, including a wire bonded die stacked over an assembly according to an embodiment of the invention as shown in FIG. 8.
Figure 25:
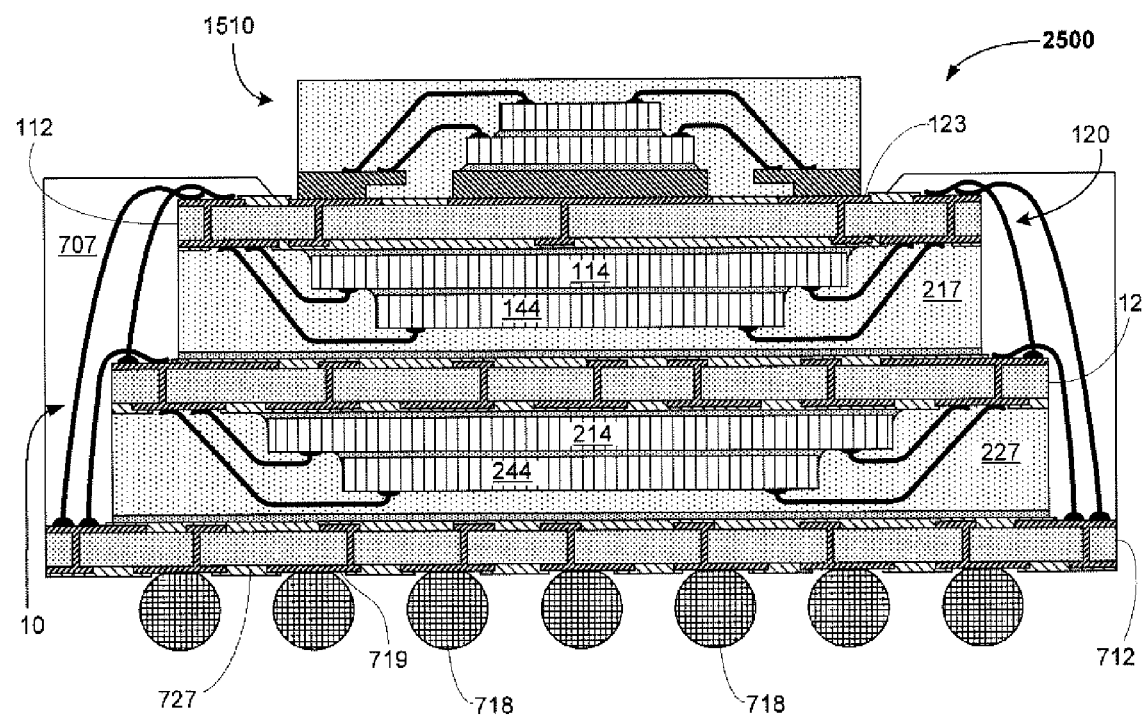
FIG. 25 is a diagrammatic sketch in a sectional view thru a stacked package assembly according to an embodiment of the invention, including a SD QFN/LFCSP stacked over an assembly according to an embodiment of the invention as shown in FIG. 8.
Figure 26:
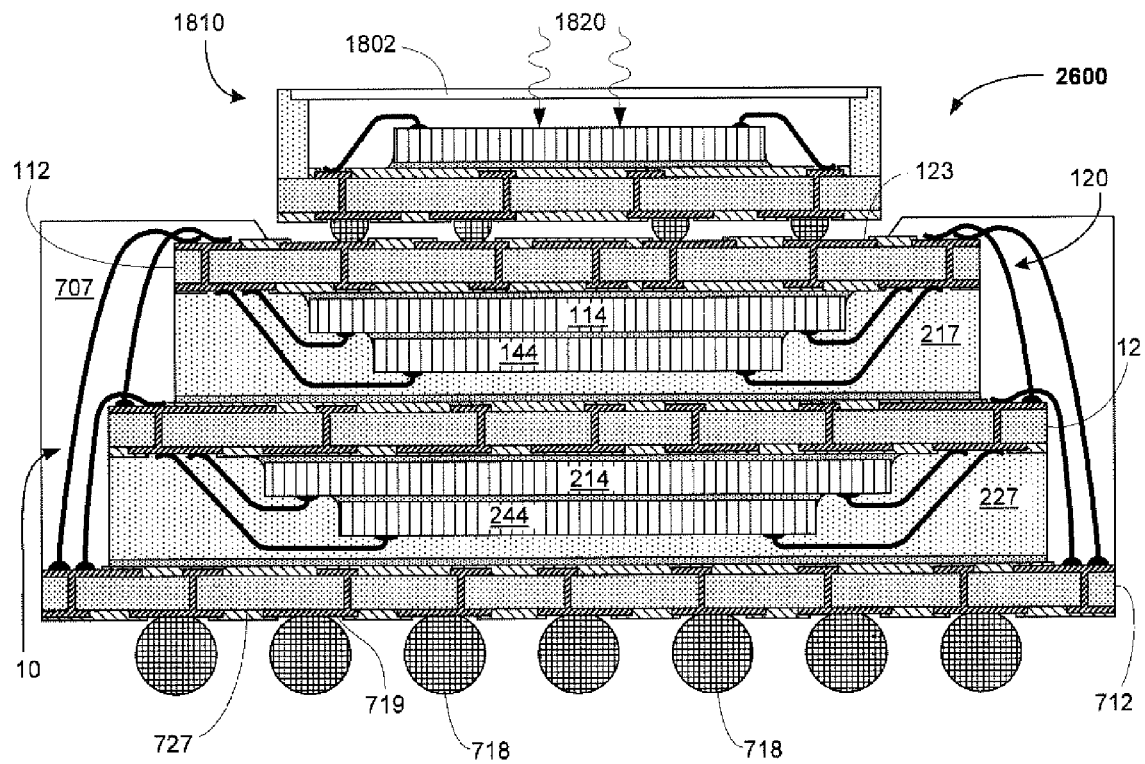
FIG. 26 is a diagrammatic sketch in a sectional view thru a stacked package assembly according to an embodiment of the invention, including an optical sensor package stacked over an assembly according to an embodiment of the invention as shown in FIG. 8.
Figure 27:
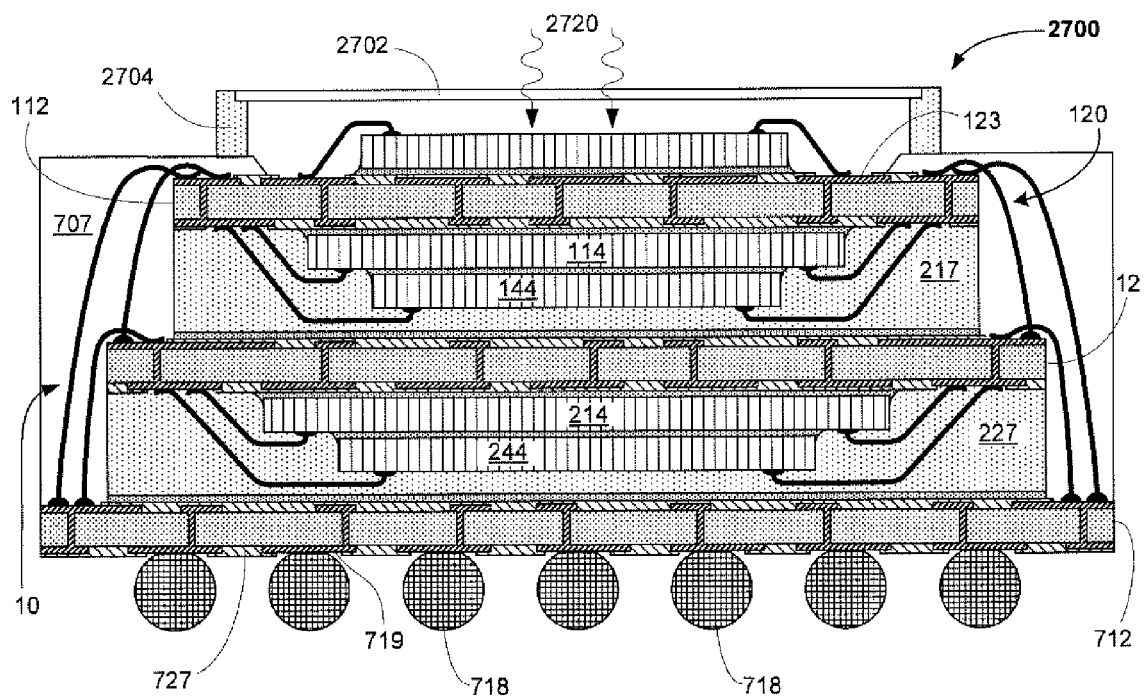
FIG. 27 is a diagrammatic sketch in a sectional view thru a stacked package assembly according to an embodiment of the invention, including an optical sensor die mounted on an assembly according to an embodiment of the invention as shown in FIG. 8.

For example, as shown in FIG. 20 a ball grid array (BGA) package can be mounted over an assembly constructed as described above with reference to FIG. 8. In FIG. 20, a BGA package 1610 having interconnect solder balls 1618 is aligned with and mounted upon the exposed area of the land side of a second CSP package 120 substrate 112, and the solder balls are reflowed onto ball pads in the metal layer 123 to form a module 2000. And for example, as shown in FIG. 21 an additional die can be mounted and electrically connected in a flip chip manner over an assembly constructed as described above with reference to FIG. 8. In FIG. 21, a flip chip 1710 is aligned with and mounted in the cavity upon the exposed area of the land side of a second CSP package 120 substrate 112, and the solder balls are reflowed onto ball pads in the metal layer 123 to form a module 2100. And for example, as shown in FIG. 22 passive devices can be mounted and electrically connected over an assembly constructed as described above with reference to FIG. 8. In FIG. 22, passive devices 2282 are mounted in the cavity upon the exposed area of the land side of a second CSP package 120 substrate 112, and the solder balls are reflowed onto ball pads in the metal layer 123 to form a module 2200. And for example, as shown in FIG. 23 a stacked die quad flat package can be mounted and electrically connected over an assembly constructed as described above with reference to FIG. 8. In FIG. 23, stacked die quad flat package 1410 is mounted in the cavity upon the exposed area of the land side of a second CSP package 120 substrate 112, and the solder balls are reflowed onto ball pads in the metal layer 123 to form a module 2300. And for example, as shown in FIG. 24 an additional die can be mounted and electrically connected by wire bonding over an assembly constructed as described above with reference to FIG. 8. In FIG. 24, a die 1610 is mounted active side upward in the cavity upon the exposed area of the land side of a second CSP package 120 substrate 112, and the solder balls are reflowed onto bail pads in the metal layer 123 to form a module 2400. And for example, as shown in FIG. 25 a stacked die quad flat nonleaded lead frame chip scale package 1510 is mounted over a stacked package assembly constructed generally as in FIG. 8. In FIG. 25, stacked die quad flat nonleaded lead frame CSP 1510 is mounted in the cavity upon the exposed area of the land side of a second CSP package 120 substrate 112, and the solder balls are reflowed onto ball pads in the metal layer 123 to form a module 2500. And for example, as shown in FIG. 26 an optical sensor package 1810, which may be an image forming device, is mounted over a stacked package assembly constructed generally as in FIG. 8. In FIG. 26 optical sensor package 1810 is mounted in the cavity upon the exposed area of the land side of a second CSP package 120 substrate 112, and the solder balls are reflowed onto ball pads in the metal layer 123 to form a module 2600. Light passes through a transparent cover or lens 1802 as indicated by arrows 1820 to reach the active side of the wire-bonded light sensor die. And for example, as shown in FIG. 27, an optical sensor die, which may be an image forming device, is mounted over a stacked package assembly constructed generally as in FIG. 8. In FIG. 27 the die is connected by wire bonds to pads 123 to form a module 2700. A transparent cover or lens 2702 is supported by a frame 2704 mounted upon the assembly encapsulation 707. Light passes through the transparent cover or lens 2702 as indicated by arrows 2720 to reach the active side of the wire-bonded light sensor die.

Figure 28:
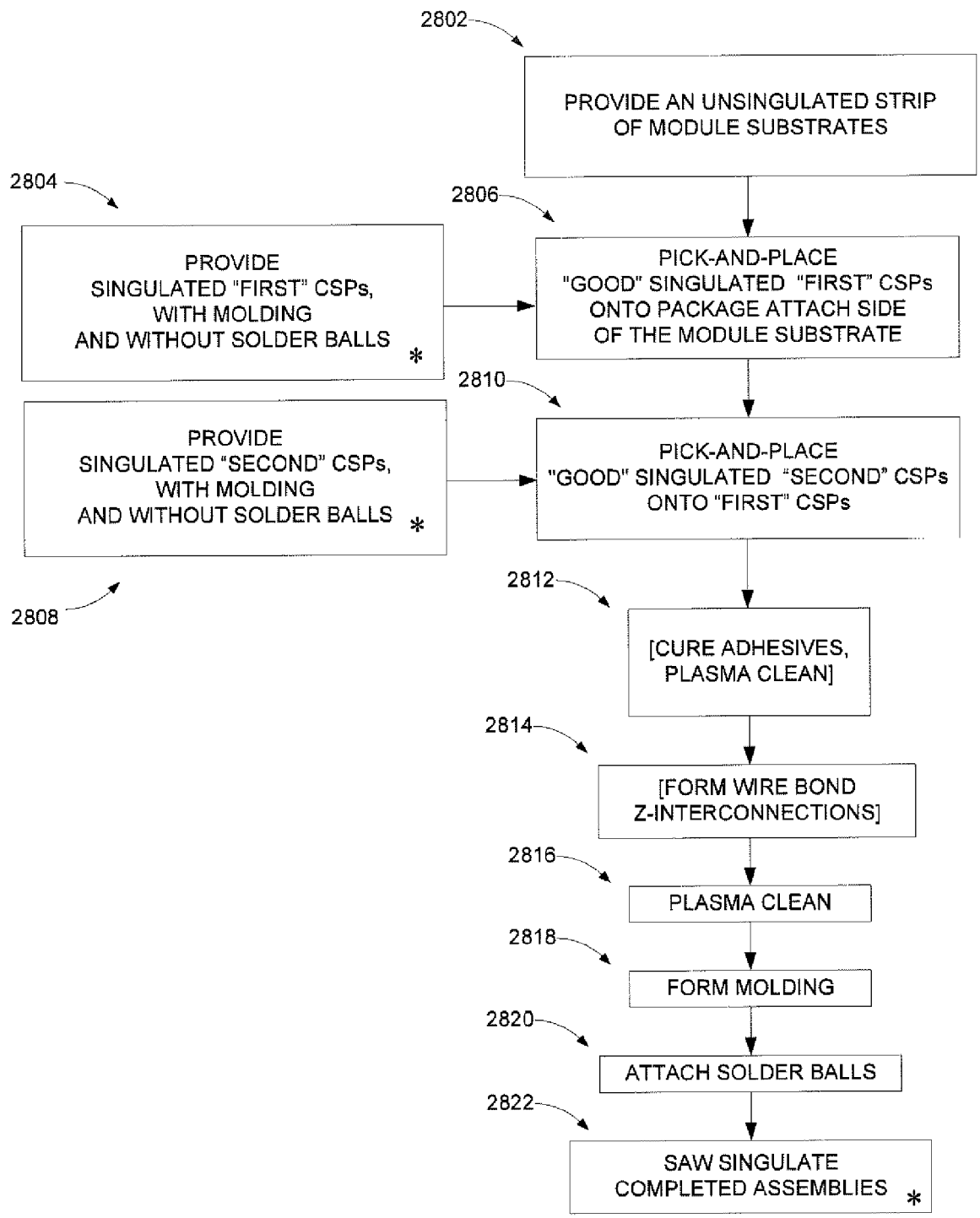
FIG. 28 is a diagram showing steps in a process for making a semiconductor assembly according to an embodiment of the invention.

Steps in a process for making an assembly as in FIG. 7 or FIG. 8 are shown as a flow diagram in FIG. 28. In a step 2802 a module substrate is provided, usually as a strip or matrix of unsingulated substrates. In a step 2804 a first CSP is provided, and in a step 2806 the first package is mounted onto the package attach side of the module substrate, using an adhesive which may be applied to the first CSP or to the module substrate, as described above with reference to FIG. 6. In a step 2808 a second CSP is provided, and in a step 2810 the first package is mounted onto the first package, using an adhesive which may be applied to the first or t the second package. Adhesive cure and plasma clean (2812) may be carried out following the m\attachment of either the first or the second package. Wire bond interconnection (2814) of the first package to the second package and/or to the module substrate may be carried out following the respective package attachment procedures. The wire bonding is followed by a further plasma clean (2816), and the package is molded or encapsulated, and solder balls are reflowed onto the land side of the module substrate, steps 2818 and 2820. The individual modules are singulated by sawing or punching.

As will be appreciated, individual ones of the various steps in the processes according to the invention can be carried out, according to the methods described herein, using substantially conventional techniques, with straightforward modification, as described herein, of conventional fabrication facilities. Such variation of conventional techniques and modification of conventional fabrication apparatus as may be required can be accomplished using the description herein without undue experimentation.

Other embodiments are within the following claims.

What is claimed is:

1. A stacked package module, comprising a module substrate; a first chip scale package mounted on a package attach side of the module substrate, the first chip scale package comprising a first package die attached to a die attach side of a first package substrate and a first package molding having a surface; a land side of a second package is mounted on the surface of the first package molding, wherein electrical interconnection of the first and second packages is made by wire bonds; and a module molding configured so that both the module substrate and a portion of a land side of the first chip scale package substrate are exposed.

2. The module of claim 1 wherein the first chip scale package side of the module comprises a second level interconnect side.

3. The module of claim 1, further comprising second-level interconnection at sites on the exposed portion of the land side of the first package substrate.

4. The module of claim 1, further comprising an additional device mounted on and electrically connected to sites on the module substrate side of the module.

5. The module of claim 4 wherein the additional device comprises a die.

6. The module of claim 4 wherein the additional device comprises a semiconductor package.

7. The module of claim 4 wherein the additional device comprises a passive device.

8. The module of claim 4 wherein the module substrate side of the module comprises a second level interconnect side.

9. The module of claim 1, further comprising second-level interconnection at sites on the land side of the module substrate.

10. The module of claim 9, further comprising an additional device mounted on and electrically connected to sites on the exposed portion of the land side of the first package substrate.

11. The module of claim 10 wherein the additional device comprises a die.

12. The module of claim 11 wherein the additional device comprises a passive device.

13. The module of claim 10 wherein the additional device comprises a semiconductor package.

* * * * *

UNITED STATES PATENT AND TRADEMARK OFFICE
CERTIFICATE OF CORRECTION

PATENT NO. : 7,394,148 B2  Page 1 of 1
APPLICATION NO. : 11/424480
DATED : July 1, 2008
INVENTOR(S) : Karnezos It is certified that error appears in the above-identified patent and that said Letters Patent is hereby corrected as shown below:

Title page, item (73), Assignee's city of residence, delete "Sinagpore" insert --Singapore--

Column 1, line 19, delete "tower" and insert therefor --lower--

Column 6, line 56, delete "1,0 mm" and insert therefor --1.0 mm--

Column 10, line 17, delete "5,226,5821" and insert therefor --5,226,582,--

Column 11, line 23, delete "saw-singulated," and insert therefor --saw-singulated;--

Column 11, line 52, delete "ball pads 63" and insert therefor --ball pads 53--

Column 11, line 58, delete "solder balls," and insert therefor --solder balls.--

Column 18, line 2, delete "bail pads" and insert therefor --ball pads--

Signed and Sealed this

Thirtieth Day of June, 2009

JOHN DOLL
*Acting Director of the United States Patent and Trademark Office*